United States Patent
Hamid

(10) Patent No.: US 11,936,343 B2
(45) Date of Patent: Mar. 19, 2024

(54) PER-BRANCH, COMBINED, AND GROUPED COMBINED MIMO DPD

(71) Applicant: Telefonaktiebolaget LM Ericsson (publ), Stockholm (SE)

(72) Inventor: Mohamed Hamid, Malmö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 17/439,699

(22) PCT Filed: Mar. 15, 2019

(86) PCT No.: PCT/EP2019/056538
§ 371 (c)(1),
(2) Date: Sep. 15, 2021

(87) PCT Pub. No.: WO2020/187384
PCT Pub. Date: Sep. 24, 2020

(65) Prior Publication Data
US 2022/0166389 A1 May 26, 2022

(51) Int. Cl.
*H03F 1/32* (2006.01)
*H03F 3/24* (2006.01)
(Continued)

(52) U.S. Cl.
CPC ............ *H03F 1/3241* (2013.01); *H03F 3/245* (2013.01); *H04B 7/0617* (2013.01); *H03F 2200/451* (2013.01); *H04B 2001/0425* (2013.01)

(58) Field of Classification Search
CPC .. H03F 1/3241; H03F 3/245; H03F 2200/451; H04B 7/0617; H04B 2001/0425
See application file for complete search history.

(56) References Cited

U.S. PATENT DOCUMENTS

| 11,228,379 B1* | 1/2022 | O'Shea | H04B 17/11 |
| 2014/0036969 A1* | 2/2014 | Wyville | H04B 1/38 |
| | | | 375/219 |

(Continued)

FOREIGN PATENT DOCUMENTS

| EP | 3286839 B1 | 4/2019 |
| WO | 2020187384 A1 | 9/2020 |

OTHER PUBLICATIONS

Kenan Li, Ning Guan, Hua Wang, "Iterative Learning Control Assisted Neural Network for Digital Predistortion of MIMO Power Amplifier", Beijing Institute of Technology, 2018 IEEE 87th Vehicular Technology Conference (VTC Spring), Jun. 3-6, 2018 (Year: 2018).*

(Continued)

*Primary Examiner* — Aristocratis Fotakis
(74) *Attorney, Agent, or Firm* — Withrow & Terranova, PLLC

(57) ABSTRACT

Systems and methods are disclosed herein for Digital Predistortion (DPD) in a Multiple Input Multiple Output (MIMO) transmitter. In some embodiments, a MIMO transmitter comprises a plurality of antenna branches comprising a respective plurality of power amplifiers coupled to a respective plurality of antenna elements. The MIMO transmitter also includes one or more DPD systems operable to predistort one or more respective groups of input signals to provide one or more respective groups of predistorted input signals for one or more respective groups of antenna branches. Each group of antenna branches comprises at least two of the plurality of antenna branches. In some embodiments, the MIMO transmitter is a massive MIMO transmitter. Embodiments of a per-branch DPD scheme for a MIMO transmitter that uses Iterative Learning Control (ILC) and kernel regression are also disclosed.

19 Claims, 18 Drawing Sheets

(51) Int. Cl.
*H04B 7/06* (2006.01)
*H04B 1/04* (2006.01)

(56) References Cited

U.S. PATENT DOCUMENTS

| | | | |
|---|---|---|---|
| 2016/0241277 A1 | 8/2016 | Rexberg et al. | |
| 2017/0047954 A1* | 2/2017 | Tian | H04B 1/0475 |
| 2018/0167091 A1 | 6/2018 | Pratt et al. | |
| 2018/0167092 A1 | 6/2018 | Hausmair et al. | |
| 2018/0316367 A1 | 11/2018 | Johansson et al. | |
| 2019/0068133 A1* | 2/2019 | Gutman | H04L 27/368 |
| 2019/0312613 A1* | 10/2019 | Guan | H04B 1/0483 |
| 2020/0186103 A1* | 6/2020 | Weber | H03F 1/3258 |
| 2021/0367564 A1* | 11/2021 | Hausmair | H03F 3/189 |

OTHER PUBLICATIONS

Ming Hui, Taijun Liu, Meng Zhang, Yan Ye, Dongya Shen and Xiangyue Ying, "Augmented radial basis function neural network predistorter for linearisation of wideband power amplifiers", Electronics Letters, Jun. 5, 2014 vol. 50 No. 12 pp. 877-879 (Year: 2014).*
Padmanabhan Madampu Suryasarman, "Digital pre-distortion for multiple antenna transmitters", Thesis, Feb. 2015 (Year: 2015).*
Abu-Mostafa, et al., "Nonlinear Transformation," Chapter 3.4, Learning from Data: A Short Course (book), 2012, pp. 99-104.
Bishop, Christopher, "Pattern Recognition and Machine Learning," 2006, Springer, 758 pages.
Lloyd, Stuart, "Least Squares Quantization in PCM," IEEE Transactions on Information Theory, vol. IT-28, Issue 2, Mar. 1982, 9 pages.
Xu, Jin, et al., "Augmented Time-Delay Twin Support Vector Regression-Based Behavioral Modeling for Digital Predistortion of RF Power Amplifier," IEEE Access, May 20, 2019, 12 pages.
Liu, Taijun, et al., "Digital Predistortion Linearization with Deep Neural Networks for 5G Power Amplifiers," European Microwave Conference in Central Europe, May 2019, Prague, Czech Republic, pp. 216-219.
Wang, Siqi, et al., "Complexity Analysis of Wideband Power Amplifiers Linearization in Mult-band Signal Transmission for Massive MIMO systems," International Microwave Symposium, Aug. 2020, IEEE, pp. 960-963.
International Search Report and Written Opinion for International Patent Application No. PCT/EP2021/066542, dated Mar. 3, 2022, 18 pages.
Abdelhafiz, Abubaker, et al., "A High-Performance Complexity Reduced Behavioral Model and Digital Predistorter for MIMO Systems With Crosstalk," IEEE Transactions on Communications, vol. 64, No. 5, May 2016, pp. 1996-2004.
Amin, Shoaib, et al., "Behavioral Modeling and Linearization of Crosstalk and Memory Effects in RF MIMO Transmitters," IEEE Transactions on Microwave Theory and Techniques, vol. 62, No. 4, IEEE, Apr. 2014, pp. 810-823.
Barradas, Filipe M., et al., "Digital Predistortion of RF PAs for MIMO Transmitters Based on the Equivalent Load," International Workshop on Integrated Nonlinear Microwave and Millimetre-Wave Circuits (INMMiC), IEEE, Graz, Austria, Apr. 20-21, 2017, 4 pages.
Bassam, Seyed Aidin, et al., "Crossover Digital Predistorter for the Compensation of Crosstalk and Nonlinearity in MIMO Transmitters," IEEE Transactions on Microwave Theory and Techniques, vol. 57, No. 5, May 2009, pp. 1119-1128.
Becerra, Juan A., et al., "Efficient linearization of a RF Transmitter under 5G waveforms through Iterated Ridge Regression," ARFTG Microwave Measurement Conference (ARFTG), 2018, 4 pages.
Chani-Cahuana, Jessica, et al., "Iterative Learning Control for RF Power Amplifier Linearization," IEEE Transactions on Microwave Theory and Techniques, vol. 64, No. 9, Sep. 2016, pp. 2778-2789.
Eun, Chansoo, et al., "A New Volterra Predistorter Based on the Indirect Learning Architecture," IEEE Transactions on Signal Processing, vol. 45, No. 1, Jan. 1997, pp. 223-227.
Hamid, Mohamed, et al., "Non-parametric spectrum cartography using adaptive radial basis functions," 2017 IEEE International Conference on Acoustics, Speech and Signal Processing (ICASSP), New Orleans, LA, USA, 2017, pp. 3599-3603.
Hausmair, Katharina, et al., "Prediction of Nonlinear Distortion in Wideband Active Antenna Arrays," IEEE Transactions on Microwave Theory and Techniques, vol. 65, No. 11, Nov. 2017, pp. 4550-4563.
Isaksson, Magnus, et al., "Wide-Band Dynamic Modeling of Power Amplifiers Using Radial-Basis Function Neural Networks," IEEE Transactions on Microwave Theory and Techniques, vol. 53, No. 11, Nov. 2005, pp. 3422-3428.
Marzetta, Thomas L., "Noncooperative Cellular Wireless with Unlimited Numbers of Base Station Antennas," IEEE Transactions on Wireless Communications, vol. 9, No. 11, Nov. 2010, pp. 3590-3600.
Morgan, Dennis R., et al., "A Generalized Memory Polynomial Model for Digital Predistortion of RF Power Amplifiers," IEEE Transactions on Signal Processing, vol. 54, No. 10, Oct. 2006, pp. 3852-3860.
Pozar, David M., "Microwave Engineering," Fourth Edition, Section 9.4, Hoboken, NJ, USA, John Wiley & Sons, Inc., 2012, pp. 475-482.
Saffar, Dhikra, et al., "Behavioral Modeling of MIMO Nonlinear Systems With Multivariable Polynomials," IEEE Transactions on Microwave Theory and Techniques, vol. 59, No. 11, Nov. 2011, pp. 2994-3003.
Zenteno, Efrain, et al., "Finding Structural Information About RF Power Amplifiers Using an Orthogonal Nonparametric Kernel Smoothing Estimator," IEEE Transactions on Vehicular Technology, vol. 65, No. 5, IEEE, May 2016, pp. 2883-2889.
International Search Report and Written Opinion for International Patent Application No. PCT/EP2019/056538, dated Nov. 14, 2019, 13 pages.

* cited by examiner

*ILC PER BRANCH MISO DPD*

*ILC COMBINED MIMO DPD*

```
┌─────────────────────────────────────────────────────────────┐
│  DETERMINE DPD MODEL PARAMETERS (E.G., WEIGHTS) FOR A       │
│  COMBINED MIMO DPD MODEL FOR THE L ANTENNA BRANCHES (e.g.,  │
│         USING ILC WITH KERNEL REGRESSION)                   │
│                         600                                 │
└─────────────────────────────────────────────────────────────┘
                              │
                              ▼
┌─────────────────────────────────────────────────────────────┐
│  PREDISTORT THE INPUT SIGNALS ($x_1$ to $x_L$) FOR THE L ANTENNA │
│  BRANCHES BASED ON THE DETERMINED DPD MODEL PARAMETERS      │
│  USING THE COMBINED MIMO DPD MODEL TO THEREBY PROVIDE       │
│  PREDISTORTED INPUT SIGNALS ($u_1$ to $u_L$) FOR THE L ANTENNA │
│                        BRANCHES                             │
│                          602                                │
└─────────────────────────────────────────────────────────────┘
```

FIG. 6

Combined DPD performance in terms of ACLR and EVM for different array sizes, M=2, K=4 centroids, and N=1000 samples

*Number of FLOPS for DPD parameters extraction*

Number of FLOPS for 1-symbol DPD execution

Number of FLOPS for DPD parameters extraction and DPD execution in a one close loop adaptation cycle assuming a 20% close loop duty cycle

*S-branch grouped combined ILC DPD structure using kernel regression for both amplitude and phase*

FOR EACH GROUP OF ANTENNA BRANCHES, DETERMINE DPD MODEL PARAMETERS (E.G., WEIGHTS) FOR A COMBINED MIMO DPD MODEL FOR THE GROUP OF ANTENNA BRANCHES (e.g., USING ILC WITH KERNEL REGRESSION)
1300

FOR EACH GROUP OF ANTENNA BRANCHES, PREDISTORT THE INPUT SIGNALS ($x_{s,1}$ to $x_{s,S}$) FOR THE GROUP OF ANTENNA BRANCHES BASED ON THE DETERMINED DPD MODEL PARAMETERS USING THE COMBINED MIMO DPD MODEL FOR THE GROUP OF ANTENNA BRANCHES TO THEREBY PROVIDE PREDISTORTED INPUT SIGNALS ($u_{s,1}$ to $u_{s,S}$) FOR THE GROUP OF ANTENNA BRANCHES
1302

*FIG. 13*

I-branches grouped combined MIMO-DPD, groups selection in a dual polarized array

*ACLR and EVM for grouped combined DPD using different values of group sizes benched marked against per branch MISO DPD*

Number of FLOPS for grounded combined DPD parameters extraction and DPD execution using different values of group sizes

*DPD options in AAS: (a) SISO DPD, (b) MISO DPD, (c) combined MIMO DPD, and (d) grouped combined MIMO-DPD*

US 11,936,343 B2

PER-BRANCH, COMBINED, AND GROUPED COMBINED MIMO DPD

This application is a 35 U.S.C. § 371 national phase filing of International Application No. PCT/EP2019/056538, filed Mar. 15, 2019, the disclosure of which is incorporated herein by reference in its entirety.

TECHNICAL FIELD

The present disclosure relates to Digital Predistortion (DPD) in a Multiple Input Multiple Output (MIMO) transmitter system.

BACKGROUND

In Advanced Antenna Systems (AASs), also known as massive Multiple Input Multiple Output (MIMO) systems, transmit signals are precoded into several (e.g., up to hundreds) transmit branches (also referred to herein as antenna branches) to enhance attainable capacity by means of beamforming [1]. Each transmit branch is terminated by an antenna fed by a Power Amplifier (PA). As in conventional Single Input Single Output (SISO) systems, hardware imperfections such as the non-linear responses of the PAs result in distorting the transmitted signals. Such distortions affect not only the transmitted signals themselves but also cause spectrum broadening, which also harms adjacent channels. Moreover, regarding AAS, having a massive number of transmit branches implies a bulky and complex hardware structure. Therefore, reduction of the hardware complexity is a necessity. One way to reduce hardware complexity is to eliminate some Radio Frequency (RF) components and compensating for their absence using digital signal processing techniques. Such components include RF isolators, which are used in conventional systems to protect the PAs from reflected back signals caused by antenna mismatch or antenna mutual coupling in multi-antenna systems [2]. Therefore, unlike SISO systems or multi-antenna systems with isolators, in an AAS, antenna mismatch and mutual coupling add more non-linear distortion, which also needs to be addressed when linearizing the PAs by means of Digital Predistortion (DPD). The present disclosure relates to an isolator-free AAS or AAS with relaxed isolation requirements. The AAS may be a Time Division Duplexing (TDD) AAS or a Frequency Division Duplexing (FDD) AAS.

There have been many investigations on how to linearize the PA outputs in an isolator-free AAS by digitally predistorting the input signals. In [3-6], the outputs of Dual Input (DI) PAs (DI-PAs) are modeled as multivariate memory polynomials considering crosstalks before and after the PAs. Motivated by the rapid complexity growth with the increase of the number of MIMO branches, in [7], a DI-PA model is proposed for modeling PAs in an AAS with multiple branches, where, for each DI-PA, the first input is the respective PA direct input while the second input is a linear product between two vectors. The first vector is the outputs of the other branches while the second vector is the antenna array coupling coefficient between those branches and the respective branch. This approach of DI-PA assumes the availability of the antenna array coupling matrix, which might not be available or at least needs to be estimated. United Stated Patent Application Publication No. 2018/0167092 describes a MIMO transmitter that utilizes Dual-Input Digital Predistortion (DI DPD) to compensate for nonlinear PAs. The DI DPD can comprise the use of a radial-basis function-based transfer function.

A commonality among previously proposed linearization techniques for PAs in an AAS is that they all use an Indirect Learning Architecture (ILA) to determine parameters (e.g., weighting coefficients) of a predistorter [8]. However, in the case of highly correlated signals, ILA suffers from numerical issues due to having a rank deficient system of linear equations to solve [9]. Making use of this high correlation among signals of different branches is adopted in [9] where coupling among highly correlated signals is described as a load change that simplifies the DPD structure. However, the solution introduced in [9] is not applicable when signals are uncorrelated and hence it is not a universal solution. Hence, there is a need for a low complexity, self-adapted, and universal in the sense of transmission rank (i.e., correlation) independent solution for DPD in an AAS.

Another common approach among previously proposed techniques for DPD in an AAS is to have a DPD actuator per transmit branch, which implies that both extraction of the DPD coefficient and DPD execution are performed as many times as the number of transmit branches in the AAS. This then implies that a considerable amount of computational resources and hence power is consumed by the overall DPD system. Furthermore, in previously proposed techniques for DPD in an AAS, coupling among different signals before and after PAs are treated differently, and it is essential to acquire knowledge about where the coupling takes place. Hence, there is also a need for a DPD solution for AAS that compromises performance, complexity, and scalability. Moreover, such solution should also handle correlated and uncorrelated signals alike. Further, this solution is desired to handle the coupling in the same way independently of whether the coupling happens before or after the PAs.

Some other notable DPD techniques are described in:
  "Efficient linearization of a RF Transmitter under 5G waveforms through Iterated Ridge Regression" by Becerra et al., which presents a method for digital predistortion of PAs using an algorithm they call Iterated Ridge Regression, IRR, that works on a Volterra kernel model,
  U.S. Patent Application Publication 2018/0167091 discloses a "massive" MIMO array that utilizes DPD to linearize the PA circuit and discusses pros and cons of having either one shared DPD for all PAs or dedicated DPDs for each PA, and
  U.S. Patent Application Publication No. 2018/0316367 discloses a linearization method used with antenna arrays, e.g. large arrays such as in AAS and "massive" MIMO. This reference teaches an embodiment in which a single linearizer could be used for linearizing all the transceiver branches in an active antenna array and embodiments in which the number of linearizers used for linearizing a set of radio transceiver branches can be made considerably smaller than the number of radio transceiver branches in an AAS.

SUMMARY

Systems and methods are disclosed herein for Digital Predistortion (DPD) in a Multiple Input Multiple Output (MIMO) transmitter. In some embodiments, a MIMO transmitter comprises a plurality of antenna branches comprising a respective plurality of Power Amplifiers (PAs) coupled to a respective plurality of antenna elements. The MIMO transmitter also includes one or more DPD systems operable to, for each group of antenna branches of one or more groups of antenna branches, determine one or more model parameters for a combined MIMO DPD scheme for the group of antenna branches, the combined MIMO DPD scheme being an Iterative Learning Control, ILC, combined MIMO DPD scheme with kernel regression. The one or more DPD systems are further operable to, for each group of antenna branches of one or more groups of antenna branches, predistort a group of input signals for the group of antenna branches to provide a respective group of predistorted input signals for the group of antenna branches based on the determined one or more model parameters in accordance with the combined MIMO DPD scheme for the group of antenna branches. Each group of antenna branches comprises at least two of the plurality of antenna branches. In some embodiments, the MIMO transmitter is a massive MIMO transmitter. By grouping the antenna branches, a combined or group combined MIMO DPD scheme is implemented, which results in reduced computational complexity, reduced implementation complexity, and scalability.

In some embodiments, the one or more groups of antenna branches comprise two or more groups of antenna branches, the two or more groups of antenna branches being a disjoint subset of the plurality of antenna branches. Further, the one or more DPD systems comprise two or more DPD systems operable to predistort two or more respective groups of input signals to provide two or more respective groups of predistorted input signals for the two or more groups of antenna branches, respectively.

In some embodiments, each DPD system of the two or more DPD systems is further operable to obtain a number, N, of samples of each of the plurality of input signals in the respective one of the two or more groups of input signals and determine a desired combined input signal, $U_s$, for the respective one of the two or more groups of antenna branches. The DPD system is further operable to generate a kernel regression matrix, $\theta_s$, for the respective one of the two or more groups of antenna branches based on the number, N, of samples of each of the plurality of input signals in the respective one of the two or more groups of input signals and compute one or more model parameters for a DPD model utilized by the DPD system to predistort the plurality of input signals in the respective one of the two or more groups of input signals based on the kernel regression matrix, $\theta_s$, and the desired combined input signal, $U_s$, for the respective one of the two or more groups of antenna branches. Further, in some embodiments, in order to determine the desired combined input signal, $U_s$, for the respective one of the two or more groups of antenna branches, each DPD system of the two or more DPD systems is further operable to initialize the desired combined input signal, $U_s$, for the respective one of the two or more groups of antenna branches and iteratively perform the following until at least one predefined criterion is satisfied:

determine an error, $E_s$, based on a difference between (a) a desired combined output signal of the respective one of the two or more groups of antenna branches and (b) an actual combined output signal of the respective one of the two or more groups of antenna branches when the desired combined input signal, $U_s$, is applied to the respective one of the two or more respective groups of antenna branches, and update the desired combined input signal, $U_s$, for the respective one of the two or more groups of antenna branches based on the error, $E_s$.

In some embodiments, the one or more model parameters are weights applied by the DPD system to predistort the plurality of input signals in the respective one of the two or more groups of input signals.

In some embodiments, the one or more groups of antenna branches consist of a single group of antenna branches comprising the plurality of antenna branches, and the one or more DPD systems consist of a single DPD system operable to predistort a plurality of input signals to provide a plurality of predistorted input signals for the plurality of antenna branches using an ILC combined MIMO DPD scheme for the plurality of antenna branches with kernel regression. Further, in some embodiments, the single DPD system is further operable to obtain a number, N, of samples of each of the plurality of input signals, determine a desired combined input signal, U, for the plurality of antenna branches, generate a kernel regression matrix, $\theta$, for the plurality of antenna branches based on the number, N, of samples of each of the plurality of input signals, and compute one or more model parameters for a DPD model utilized by the single DPD system to predistort the plurality of input signals based on the kernel regression matrix, $\theta$, and the desired combined input signal, U. Further, in some embodiments, in order to determine the desired combined input signal, U, for the plurality of antenna branches, the single DPD system is further operable to initialize the desired combined input signal, U, for the plurality of antenna branches and iteratively perform the following until at least one predefined criterion is satisfied:

determine an error, E, based on a difference between (a) a desired combined output signal of the plurality of antenna branches and (b) an actual combined output signal of the plurality of antenna branches when the desired combined input signal, U, is applied to the plurality of antenna branches, and update the desired combined input signal, U, for the plurality of antenna branches based on the error, E.

In some embodiments, the one or more model parameters are weights applied by the single DPD system to predistort the plurality of input signals.

In some embodiments, the ILC group combined MIMO DPD scheme with kernel regression for the respective one of the two or more groups of antenna branches with kernel regression or the ILC combined MIMO DPD scheme with kernel regression uses Radial Basis Function (RBF) kernels.

In some embodiments, the ILC group combined MIMO DPD scheme with kernel regression for the respective one of the two or more groups of antenna branches with kernel regression or the ILC combined MIMO DPD scheme with kernel regression uses Generalized Memory Polynomial (GMP) bases as kernels.

In some embodiments, the ILC group combined MIMO DPD scheme with kernel regression for the respective one of the two or more groups of antenna branches with kernel regression or the ILC combined MIMO DPD scheme with kernel regression accounts for memory effects.

Embodiments of a method of performing DPD in a MIMO transmitter comprising a plurality of antenna branches comprising a respective plurality of power amplifiers coupled to a respective plurality of antenna elements are also disclosed. In some embodiments, the method of performing DPD in the MIMO transmitter comprises, for each group of antenna branches of one or more groups of antenna branches, determining one or more model parameters for a combined MIMO DPD scheme for the group of antenna branches where the combined MIMO DPD scheme is an ILC combined MIMO DPD scheme with kernel regression, and predistorting a group of input signals for the group of antenna branches to provide a respective group of predistorted input signals for the group of antenna branches based on the determined model parameters in accordance with the combined MIMO DPD scheme for the group of antenna branches. Each group of antenna branches comprises at least two of the plurality of antenna branches.

In some embodiments, the one or more groups of antenna branches comprise two or more groups of antenna branches, the two or more groups of antenna branches being disjoint subsets of the plurality of antenna branches.

In some embodiments, for each group of antenna branches of the two or more groups of antenna branches, determining the one or more model parameters of the combined MIMO DPD scheme comprises obtaining a number, N, of samples of each of a plurality of input signals in the group of input signals, determining a desired combined input signal, $U_s$, for the group of antenna branches, generating a kernel regression matrix, $\theta_s$, for the group of antenna branches based on the number, N, of samples of each of the plurality of input signals in the group of input signals, and computing the one or more model parameters for the combined MIMO DPD scheme for the group of antenna branches based on the kernel regression matrix, $\theta_s$, and the desired combined input signal, $U_s$, for the group of antenna branches. In some embodiments, for each group of antenna branches of the two or more groups of antenna branches, determining the desired combined input signal, $U_s$, for the group of antenna branches comprises initializing the desired combined input signal, $U_s$, for the respective one of the two or more respective groups of antenna branches and iteratively performing the following until at least one predefined criterion is satisfied:
    determining an error, $E_s$, based on a difference between (a) a desired combined output signal of the group of antenna branches and (b) an actual combined output signal of the group of antenna branches when the desired combined input signal, $U_s$, is applied to the respective one of the two or more respective groups of antenna branches, and
    updating the desired combined input signal, $U_s$, for the group of antenna branches based on the error, $E_s$.

Further, in some embodiments, the one or more model parameters are weights applied to predistort the plurality of input signals in the group of input signals.

In some embodiments, the one or more groups of antenna branches consist of a single group of antenna branches, the single group of antenna branches comprising the plurality of antenna branches, and the combined MIMO DPD scheme for the group of antenna branches is an ILC combined MIMO DPD scheme for the plurality of antenna branches with kernel regression. Further, in some embodiments, for the single group of antenna branches, determining the one or more model parameters of the combined MIMO DPD scheme comprises obtaining a number, N, of samples of each of a plurality of input signals for the single group of antenna branches, determining a desired combined input signal, U, for the plurality of antenna branches in the single group of antenna branches, generating a kernel regression matrix, $\theta$, for the plurality of antenna branches based on the number, N, of samples of each of the plurality of input signals, and computing the one or more model parameters for the ILC combined MIMO DPD scheme based on the kernel regression matrix, $\theta$, and the desired combined input signal, U. In some embodiments, for the single group of antenna branches, determining the desired combined input signal, U, for the plurality of antenna branches in the single group of antenna branches comprises initializing the desired combined input signal, U, for the plurality of antenna branches and iteratively performing the following until at least one predefined criterion is satisfied:
    determining an error, E, based on a difference between (a) a desired combined output signal of the plurality of antenna branches and (b) an actual combined output signal of the plurality of antenna branches when the desired combined input signal, U, is applied to the plurality of antenna branches, and
    updating the desired combined input signal, U, for the plurality of antenna branches based on the error, E, when the desired combined input signal, U, is applied to the plurality of antenna branches.

In some embodiments, the one or more model parameters for the ILC combined MIMO DPD scheme are weights applied to predistort the plurality of input signals.

In some embodiments, the ILC group combined MIMO DPD scheme with kernel regression for the respective one of the two or more groups of antenna branches with kernel regression or the ILC combined MIMO DPD scheme with kernel regression uses RBF kernels.

In some embodiments, the ILC group combined MIMO DPD scheme with kernel regression for the respective one of the two or more groups of antenna branches with kernel regression or the ILC combined MIMO DPD scheme with kernel regression uses GMP bases as kernels.

In some embodiments, the ILC group combined MIMO DPD scheme with kernel regression for the respective one of the two or more groups of antenna branches with kernel regression or the ILC combined MIMO DPD scheme with kernel regression accounts for memory effects.

In some other embodiments, a MIMO transmitter comprises a plurality of antenna branches comprising a respective plurality of PAs coupled to a respective plurality of antenna elements and a plurality of ILC DPD systems operable to predistort a plurality of input signals for the plurality of antenna branches, respectively, using an ILC per branch MIMO DPD scheme with kernel regression.

In some embodiments, each ILC DPD system of the plurality of ILC DPD systems is further operable to obtain a number, N, of samples of a respective one of the plurality of input signals, determine a desired input signal, $U_l$, for a respective one of the plurality of antenna branches, generate a kernel regression matrix, $\theta_l$, for the respective one of the plurality of antenna branches based on the number, N, of samples of the respective one of the plurality of input signals, and compute one or more model parameters for a DPD model utilized by the ILC DPD system to predistort the respective one of the plurality of input signals based on the kernel regression matrix, $\theta_l$, and the desired input signal, $U_l$, for the respective one of the plurality of antenna branches.

In some embodiments, each ILC DPD system of the plurality of ILC DPD systems is further operable to generate the kernel regression matrix, $\theta_l$, for the respective one of the plurality of antenna branches based on: (a) the number, N, of samples of the respective one of the plurality of input signals and (b) the number, N, of samples of one or more additional input signals from among the plurality of input signals. In some embodiments, in order to determine the desired input signal, $U_l$, for a respective one of the plurality of antenna branches, each ILC DPD system of the plurality of ILC DPD systems is further operable to initialize the desired input signal, $U_l$, for the respective one of the plurality of antenna branches and iteratively perform the following until at least one predefined criterion is satisfied:
    determine an error, $E_l$, based on a difference between (a) a desired output signal of the respective one of the plurality of antenna branches and (b) an actual output signal of the respective one of the plurality of antenna branches when the desired input signal, $U_I$, is applied to the respective one of the plurality of antenna branches, and update the desired input signal, $U_I$, for the respective one of the plurality of antenna branches based on the error, $E_I$.

Each ILC DPD system of the plurality of ILC DPD systems is further operable to obtain a new number, N, of samples of the respective one of the plurality of input signals, generate a new kernel regression matrix, $\theta_I$, for the respective one of the plurality of antenna branches based on the new number, N, of samples of the respective one of the plurality of input signals, and compute one or more new model parameters for the DPD model utilized by the ILC DPD system to predistort the respective one of the plurality of input signals based on the new kernel regression matrix, $\theta_I$, and the new desired input signal, $U_I$, for the respective one of the plurality of antenna branches. In some embodiments, the one or more model parameters are weights applied by the ILC DPD system to predistort the respective one of the plurality of input signals.

In some embodiments, the ILC per branch MIMO DPD scheme with kernel regression uses RBF kernels.

In some embodiments, the ILC per branch MIMO DPD scheme with kernel regression takes into account memory effects to a predefined memory depth.

In some embodiments, the ILC per branch MIMO DPD scheme accounts for antenna coupling effects.

In some other embodiments, a method of performing DPD in a MIMO transmitter comprising a plurality of antenna branches comprising a respective plurality of PAs coupled to a respective plurality of antenna elements comprises determining one or more model parameters for each antenna branch of the plurality of antenna branches for an ILC per branch MIMO DPD scheme with kernel regression and predistorting a plurality of input signals for the plurality of antenna branches, respectively, to provide a respective plurality of predistorted input signals for the plurality of antenna branches based on the determined one or more model parameters in accordance with the ILC per branch MIMO DPD scheme with kernel regression.

In some embodiments, determining the one or more model parameters for each antenna branch of the plurality of antenna branches comprises, for each antenna branch, obtaining a number, N, of samples of a respective one of the plurality of input signals, determining a desired input signal, $U_I$, for the of antenna branch, generating a kernel regression matrix, $\theta_I$, for the antenna branch based on the number, N, of samples of the respective one of the plurality of input signals, and computing the one or more model parameters for the antenna branch based on the kernel regression matrix, $\theta_I$, and the desired input signal, $U_I$, for the antenna branch. In some embodiments, generating the kernel regression matrix, $\theta_I$, for the antenna branch comprises generating the kernel regression matrix, $\theta_I$, for the antenna branch based on: (a) the number, N, of samples of the respective one of the plurality of input signals and (b) the number, N, of samples of one or more additional input signals from among the plurality of input signals. In some embodiments, determining the desired input signal, $U_I$, for the antenna branch comprises initializing the desired input signal, $U_I$, for the respective one of the plurality of antenna branches and iteratively performing the following until at least one predefined criterion is satisfied:

determining an error, $E_I$, based on a difference between (a) a desired output signal of the antenna branch and (b) an actual output signal of the antenna branch when the desired input signal, $U_I$, is applied to the respective one of the plurality of antenna branches, and updating the desired input signal, $U_I$, for the antenna branch based on the error, $E_I$.

Determining the one or more model parameters for each antenna branch of the plurality of antenna branches further comprises, for each antenna branch, obtaining a new number, N, of samples of the respective one of the plurality of input signals, generating a new kernel regression matrix, $\theta_I$, for the antenna branch based on the new number, N, of samples of the respective one of the plurality of input signals, and computing one or more new model parameters for the antenna branch based on the new kernel regression matrix, $\theta_I$, and the new desired input signal, $U_I$, for the antenna branch.

In some embodiments, the one or more model parameters are weights applied to predistort the respective one of the plurality of input signals.

In some embodiments, the ILC per branch MIMO DPD scheme with kernel regression uses RBF kernels.

In some embodiments, the ILC per branch MIMO DPD scheme with kernel regression takes into account memory effects to a predefined memory depth.

In some embodiments, the ILC per branch MIMO DPD scheme accounts for antenna coupling effects.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 6 is a flow chart that illustrates the operation of the MIMO transmitter of FIG. 5 in accordance with some embodiments of the present disclosure;

FIG. 13 is a flow chart that illustrates the operation of the MIMO transmitter of FIG. 12 in accordance with some embodiments of the present disclosure;

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Systems and methods for Digital Predistortion (DPD) in a Multiple Input Multiple Output (MIMO) transmitter system are disclosed. Preferably, the MIMO transmitter is a massive MIMO transmitter system, which is also referred to herein as an Advanced Antenna System (AAS). As used herein, a massive MIMO transmitter system can have up to hundreds of transmit branches for even more antenna branches. Further, the MIMO transmitter system is preferably isolator-free (i.e., has a Radio Frequency (RF) isolator free architecture). As described below in detail, in some embodiments, the MIMO transmitter system includes a DPD system that operates in accordance with an Iterative Learning Control (ILC) per-branch Multiple Input Single Output (MISO) DPD with kernel regression scheme. In some other embodiments, the MIMO transmitter system includes a DPD system that operates in accordance with a combined or group combined MIMO DPD scheme. In some embodiments, the combined or group combined MIMO DPD scheme uses ILC. In some embodiments, the combined or group combined MIMO DPD scheme uses ILC with kernel regression.

Figure 1:
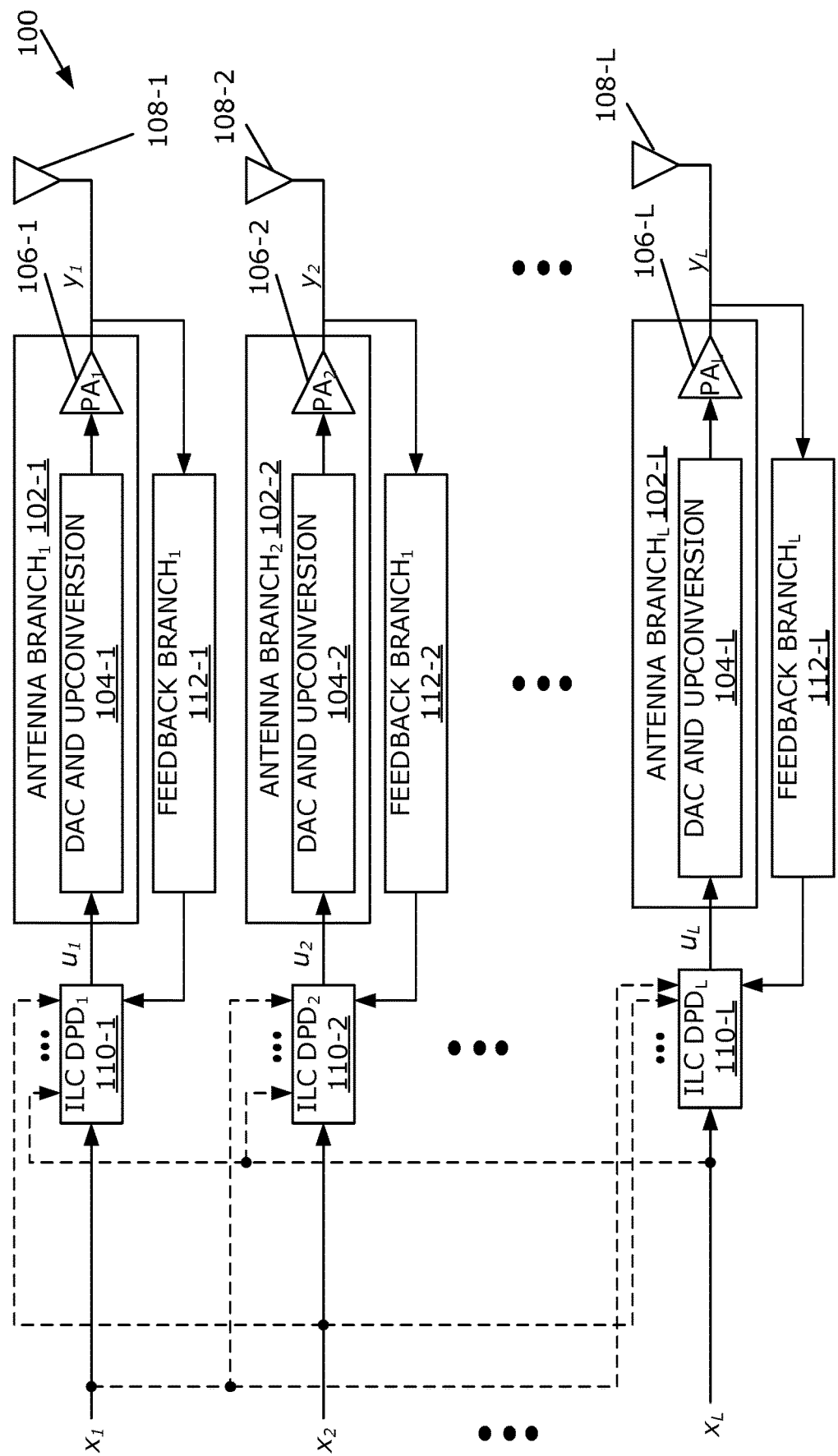
FIG. 1 illustrates an example of a Multiple Input Multiple Output (MIMO) transmitter that performs Digital Predistortion (DPD) in accordance with an Iterative Learning Control (ILC) per-branch Multiple Input Single Output (MISO) DPD scheme in accordance with some embodiments of the present disclosure.

In this regard, FIG. 1 illustrates an example of a MIMO transmitter 100 that performs DPD in accordance with an ILC per-branch MISO DPD scheme in accordance with some embodiments of the present disclosure. As discussed below, the ILC per-branch MISO DPD scheme uses kernel regression. As illustrated, the MIMO transmitter 100 includes a number of antenna branches 102-1 through 102-L, where "L" is the number of antenna branches. The antenna branches 102 may alternatively be referred to herein as "transmit branches" or "radio branches". The antenna branches 102-1 through 102-L include respective Digital to Analog Conversion (DAC) and upconversion circuitry 104-1 through 104-L and respective Power Amplifiers (PAs) 106-1 through 106-L. The outputs of the PAs 106-1 through 106-L are coupled to respective antenna elements 108-1 through 108-L.

The MIMO transmitter 100 also includes ILC DPD systems 110-1 through 110-L for the respective antenna branches 102-1 through 102-L. Rather than using a multivariate memory polynomial as a PA model in the MIMO transmitter 100 and then finding the inverse model using Indirect Learning Architecture (ILA) in the conventional manner, the ILC DPD systems 110-1 through 110-L use kernel regression and ILC to perform DPD in the MIMO transmitter 110, as described below in detail. While not illustrated, each ILC DPD system 110 includes a DPD actuator(s) that predistorts a respective input signal based on one or more DPD parameters (e.g., weights) and a DPD adaptor(s) that adaptively configures the DPD parameters based on a feedback signal from the output of the respective antenna branch 102 and, optionally, one or more of the input signals for one or more of the other antenna branches 102, as described below in detail. Here, the DPD adaptor uses ILC with kernel regression to adaptively compute the DPD parameters, as will be described below in detail. Note that, in the embodiments described herein, there are two DPD actuators, one for amplitude and one for phase. The MIMO transmitter 100 also includes feedback branches 112-1 through 112-L having inputs coupled to the outputs of the respective antenna branches 102-1 through 102-L and outputs that provide the feedback signals to the respective ILC DPD systems 110-1 through 110-L. As will be appreciated by one of skill in the art, the feedback branches 112-1 through 112-L generally include downconversion circuitry and Analog to Digital Conversion (ADC) circuitry.

In operation, input signals $x_1$ to $x_L$ for the respective antenna branches 102-1 through 102-L are predistorted by the respective ILC DPD systems 110-1 through 110-L to provide respective predistorted input signals $u_1$ to $u_L$. The predistorted input signals $u_1$ to $u_L$ are then processed by the respective antenna branches 102-1 through 102-L to provide transmit signals $y_1$ to $y_L$.

Figure 2:
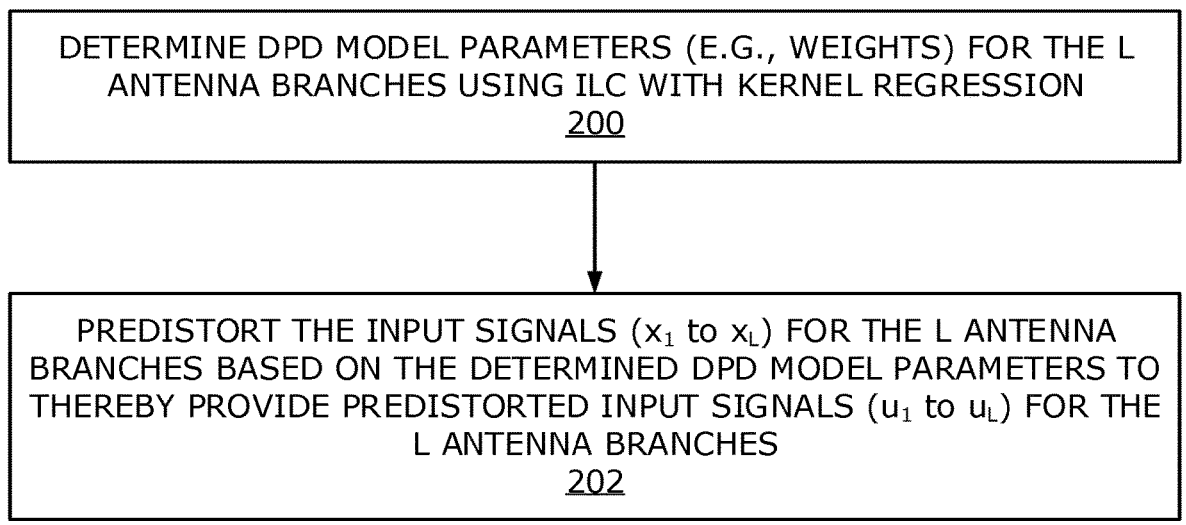
FIG. 2 is a flow chart that illustrates the operation of the MIMO transmitter of FIG. 1 in accordance with some embodiments of the present disclosure.

FIG. 2 is a flow chart that illustrates the operation of the MIMO transmitter 100 in accordance with some embodiments of the present disclosure. As illustrated, the ILC DPD systems 110-1 through 110-L determine one or more DPD model parameters for the respective antenna branches 102-1 through 102-L using ILC with kernel regression (step 200). Thus, the MIMO transmitter 100 is said to perform MIMO DPD using an ILC per branch DPD scheme with kernel regression. Further, in some embodiments, when determining the DPD model parameters, coupling between antenna elements 108 is considered by each ILC DPD system 110 using additional input signal(s) for a subset of the other antenna branches 102 when determining the DPD model parameters. When doing so, the ILC per branch DPD scheme is referred to herein as an ILC per branch MISO DPD scheme. The ILC DPD systems 110-1 through 110-L predistort the input signals $x_1$ to $x_L$ for the respective antenna branches 102-1 through 102-L to provide respective predistorted input signals $u_1$ to $u_L$ for the antenna branches 102-1 through 102-L based on the determined DPD model parameters (step 202).

Figure 3:
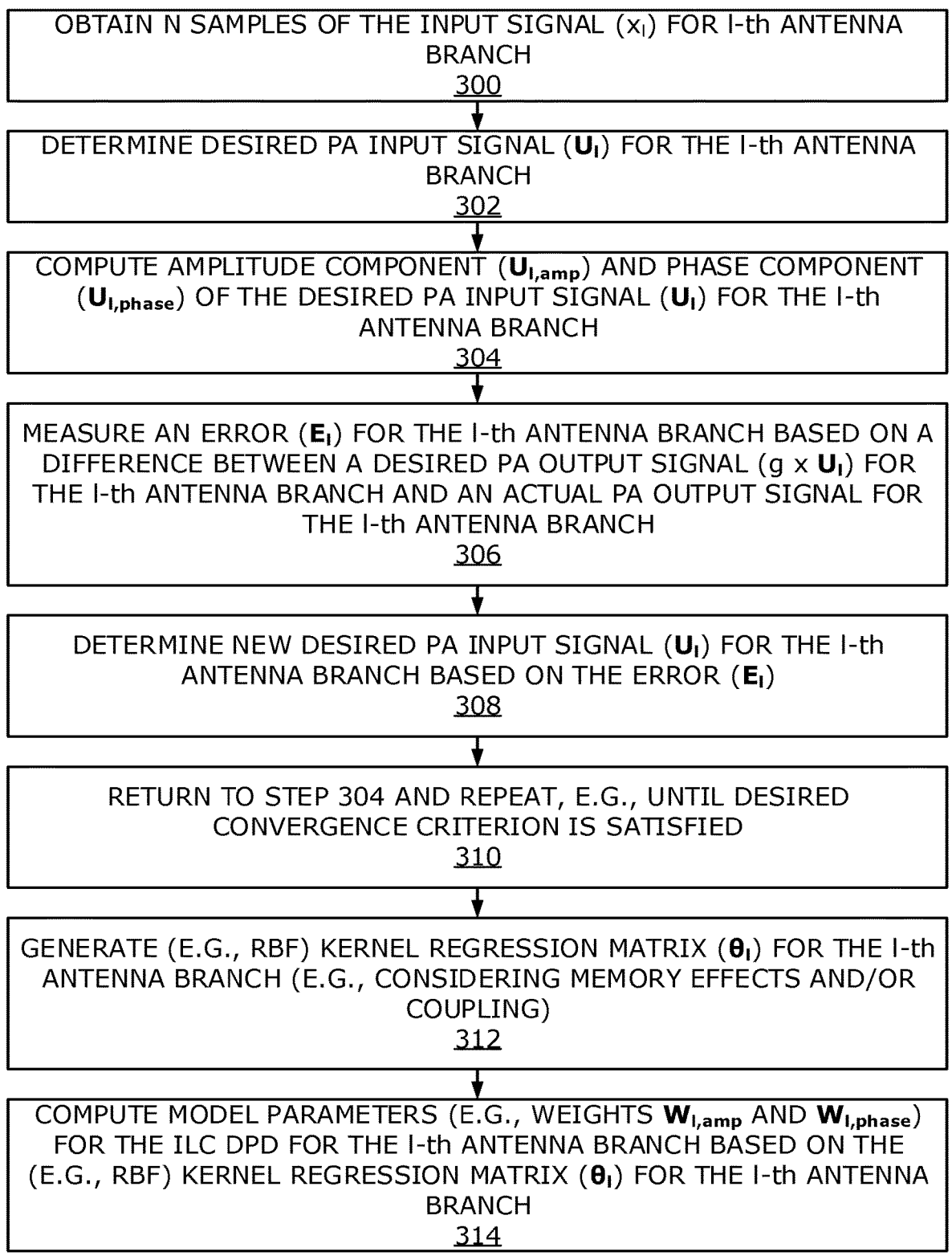
FIG. 3 is a flow chart that illustrates the operation of the ILC DPD system for an I-th antenna branch of the MIMO transmitter of FIG. 1 in accordance with some embodiments of the present disclosure.

FIG. 3 is a flow chart that illustrates the operation of the ILC DPD system 110-$l$ for the l-th antenna branch 102-$l$ in accordance with some embodiments of the present disclosure. In particular, this process can be understood as being details for one embodiment of step 200 of FIG. 2. Note that this process is separately performed by each of the L ILC DPD systems 110-1 through 110-L. The description here is for one of those ILC DPD systems, which is denoted as the l-th ILC DPD system 110-$l$. Also note that while the term "steps" is used, these "steps" (or actions) may be performed in any suitable order unless otherwise required and, in some implementations, some of the steps may be performed concurrently.

As illustrated, the ILC DPD system 110-*l* for the l-th antenna branch 102-*l* obtains N input samples of the input signal $x_l$ for the l-th antenna branch 102-*l* (step 300). This collection of input samples can be expressed in matrix form as:

$$X_l = \begin{bmatrix} x_l(1) \\ x_l(2) \\ \vdots \\ x_l(N) \end{bmatrix}.$$

As illustrated, the ILC DPD system 110-*l* determines a desired PA input signal ($U_l$) for the l-th antenna branch 102-*l* (step 302). Here, in this context, this can also be said to be initialing the desired PA input signal ($U_l$) for the l-th antenna branch 102-*l*. In this example, the desired PA input signal ($U_l$) is initiated as:

$$U_l = \frac{Y_{l,d}}{g}$$

where $U_l$ is defined as:

$$U_l \in \mathbb{R}^{N \times 1} = \begin{bmatrix} u_l(1) \\ u_l(2) \\ \vdots \\ u_l(N) \end{bmatrix}.$$

Note that $u_l(n)$ denotes an n-th sample of the desired input signal $u_l$ (i.e., the predistorted input signal) for the l-th antenna branch 102-*l*, and N is the total number of samples. $Y_{l,d}$ is the desired combined output signal for l-th antenna branch 102-*l*. In other words, $Y_{l,d}$ is the linearly amplified output signal, which can be represented as:

$$Y_{l,d} = g X_l.$$

The ILC DPD system 110-*l* computes an amplitude component ($U_{l,amp}$) and a phase component ($U_{l,phase}$) of the desired PA input signal ($U_l$) (step 304). The amplitude component ($U_{l,amp}$) and the phase component ($U_{l,phase}$) of the desired PA input signal ($U_l$) can be expressed as:

$$U_{l,amp} \in \mathbb{R}^{N \times 1} = \begin{bmatrix} |u_l(1)| \\ |u_l(2)| \\ \vdots \\ |u_l(N)| \end{bmatrix}$$

and $$U_{l,phase} \in \mathbb{R}^{N \times 1} = \begin{bmatrix} \phi(u_l(1)) \\ \phi(u_l(2)) \\ \vdots \\ \phi(u_l(1)) \end{bmatrix}.$$

Note that, here, $|u_l(n)|$ denotes an amplitude component of the n-th sample of the input signal $u_l$ and $\phi(u_l(n))$ denotes a phase component of the n-th sample of the input signal $u_l$.

While not illustrated in the flow chart of FIG. 3, the ILC DPD system 110-*l* then applies the desired PA input signal ($U_l$) to the antenna branch 102-*l*. Using the feedback signal from the feedback branch 112-*l*, the ILC DPD system 110-*l* measures an error ($E_l$) between: (a) the N samples of the actual output $y_l$ of the PA 106-*l* (i.e., the output of the l-th antenna branch 102-*l*) resulting from the desired PA input signal ($U_l$) for the l-th antenna branch 102-*l* and (b) the N samples of the desired output signal $y_{l,d}$ of the PA 106-*l* (i.e., of the output of the l-th antenna branch 102-*l*) (step 306). In matrix form, the N samples of the actual output signal $y_l$ are expressed as $Y_l$, and the N samples of the desired output signal $y_{l,d}$ are expressed as $Y_{l,d}$.

The ILC DPD system 110-*l* computes a new desired input signal $U_{l,new}$ for the l-th antenna branch 102-*l* based on the measured error ($E_l$) (step 308). In other words, the ILD DPD system 110-*l* updates the desired input signal desired input signal $U_l$ for the l-th antenna branch 102-*l* based on the measured error ($E_l$). In this example, the new (i.e., updated) desired input signal $U_{l,new}$ is computed as:

$$U_{l,new} = U_l + \varepsilon E_l.$$

Note that $\varepsilon$ is a constant known as the learning gain, which is equivalent to 1/g, where "g" is the linear gain. While not necessary, further explanation regarding $\varepsilon$ can be found in [10].

The process then returns to step 304 and is repeated, e.g., until a desired convergence criterion is satisfied (e.g., repeated until the error $E_l$ is within a predefined acceptable range, repeated until a defined a maximum number of iterations have been performed, or the like) (step 310).

Once convergence is reached, the new (i.e., updated) desired input signal $U_{l,new}$ for the l-th antenna branch 102-*l* at that point is then determined to be the desired input signal for the l-th antenna branch 102-*l*. As such, this new desired input signal $U_{l,new}$ for the l-th antenna branch 102-*l* at the point of convergence is referred to as the desired input signal $U_l$ for the l-th antenna branch 102-*l* for the reminder of the process of FIG. 3.

Figure 4:
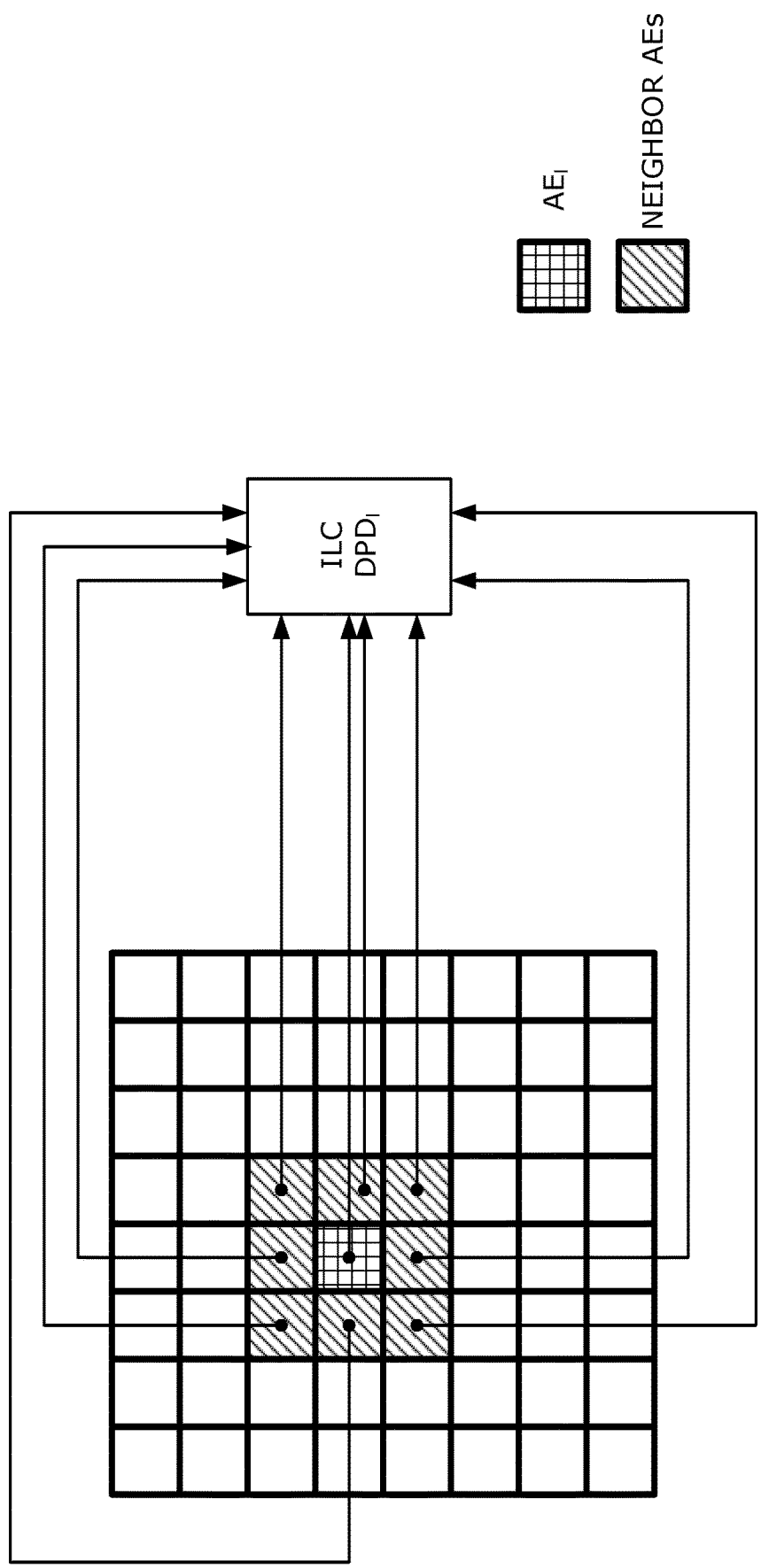
FIG. 4 illustrates one example of the set of antenna branches considered by the ILC DPD system for the I-th antenna branch in accordance with one example embodiment of the present disclosure.

The ILC DPD system 110-*l* generates a kernel regression matrix $\theta_l$ for the l-th antenna branch 102-*l* (step 312). In the example embodiment here, the kernel regression matrix $\theta_l$ is generated in such a manner as to compensate for both memory effects and coupling between the antenna element 108-*l* and a subset of the other antenna elements 108. More specifically, the ILC DPD system 110-*l* generates the kernel regression matrix $\theta_l$ as follows:

Define vector $z_l(n)$ as:

$$z_l(n) \in \mathbb{R}^{(M_l+1)+\Sigma_{j \in J}(M_j+1)} = [|x_l(n)|, |x_l(n-1)|, \ldots, |x_l(n-M_l)|, \ldots, |x_{jC}(n)|, |x_{jC}(n-1)|, \ldots, |x_{jC}(n-M_{jC})|]$$

where J is a set of antenna branches for which mutual coupling is considered for the l-th antenna branch, where J is defined as:

$$J = \{j1, \ldots jC\}$$

where C is the number of antenna branches for which mutual coupling is considered for the l-th antenna branch, j1 is the index of the first such antenna branch, j2 is the index of the second such antenna branch, and jC is the index of the C-th such antenna branch. As one example, the set of antenna branches J includes the neighbor antenna elements as illustrated in FIG. 4.

Define regressors $\theta^i_l \in \mathbb{R}^{N \times K}$ as:

$$\theta_l^i = \begin{bmatrix} \theta_{l,11}^i & \cdots & \theta_{l,1K}^i \\ \vdots & \ddots & \vdots \\ \theta_{l,N1}^i & \cdots & \theta_{l,NK}^i \end{bmatrix}$$

where $$\theta_{l,nk}^i = \varphi(\mu_k, z_{l,i}(n)).$$

Note that kernel regression is based on the assumption that every input-output pair (or representative centroids of the input space) in the data set influences the estimation of a non-linear output corresponding to a specific input based on the Euclidian distance between the two inputs in their vector space. The representative centroids of the input space are denoted as $\mu_k$, k:1→K, where K is the number of representative centroids of the input space. In the example embodiments described herein, the Lloyd algorithm can be used to identify the centroids $\mu_k$, k:1→K. As PAs are amplitude driven devices [13], the signal amplitude support is taken as the input space, and the amplitude and phase responses are thereafter estimated individually. Also note that $z_{l,i}(n)$ denotes the i-th element of the vector $z_l(n)$.

In this example, Radial Basis Function (RBF) kernels are used. Note, however, that any other type kernel may be used (e.g., kernels based on Generalized Memory Polynomial (GMP) bases). Using RBF kernels, for each value of i=1,2, . . . L(M+1) where M is the memory depth considered for memory effects for the l-th antenna branch 102-$l$, elements ($\theta_{l,nk}^i$) for the i-th regressor $\theta_l^i$ for the l-th antenna branch 102-$l$ are computed, for each value of n (where n=1, . . . , N) and each value of k (where k=1, . . . , K) as:

$$\theta_{l,nk}^i = \varphi(\mu_k, z_{l,i}(n)) = \exp(-\gamma_k \|\mu_k - z_{l,i}(n)\|)$$

Importantly, i is the index for the vector $z_l(n)$ such that:

$$z_{l,1}(n) = |x_l(n)|$$
$$z_2(n) = |x_l(n-1)|$$
$$\ldots$$
$$z_{M_l+1}(n) = |x_l(n-M)|$$
$$\ldots$$
$$z_{(M_l+1)+\sum_{j=1}^J (M_j+1)}(n) = |x_J(n-M_J)|.$$

Construct the RBF kernel regression matrix $\theta_l$ for the l-th antenna branch 102-$l$ as:

$$\theta_l \in \mathbb{R}^{N \times (1+K((M_l+1)+\in_{j=1}^J(M_j+1)))} = [1_N, \theta^1, \ldots, \theta^{(M_l+1)+\in_{j=1}^J(M_j+1)}]$$

The ILC DPD system 110-$l$ computes the DPD parameters for the ILC DPD system 110-$l$ based on the kernel regression matrix $\theta_l$ as well as the amplitude component ($U_{l,amp}$) and the phase component ($U_{l,phase}$) of the desired input signal ($U_l$) (step 314). In this example, the DPD parameters are amplitude weights ($W_{l,amp}$) and phase weights ($W_{l,phase}$) for the l-th antenna branch 102-$l$, which are computed as:

$$W_{l,amp} = (\theta_l^T \theta_l)^{-1} \theta_l^T U_{l,amp}$$

and $$W_{l,phase} = (\theta_l^T \theta_l)^{-1} \theta_l^T U_{l,phase}.$$

While not illustrated in the flow chart of FIG. 3, the ILC DPD system 110-$l$ then applies the computed weights $W_{l,amp}$ and $W_{l,phase}$ to predistort (future samples of) the input signal $x_l$ to provide the predistorted input signal $u_l$, which is then processed by the l-th antenna branch 102-$l$ to output the transmit signal $y_l$ for the l-th antenna branch 102-$l$.

Note that the process of FIG. 3 finds $U_l$, and as such gives the corresponding desired predistorted input signal for the respective samples of the input signal that linearize the PA 106-$l$. It is too computationally expensive to perform the linearization on a sample by sample level; instead, U is modeled as a function of the input samples, and this is what is referred to herein as "ILC DPD". It should also be noted that while the process of FIG. 3 considers coupling between antenna elements 108, the present disclosure is not limited thereto. For instance, the process may not consider coupling between the antenna branches 102, which is equivalent to J being an empty set.

Using the ILC per-branch DPD scheme described above, similar performance as the Dual Input (DI) PA (DI-PA) approach proposed in [7] can be achieved while needing five times less Floating Point Operations (FLOPS). The technique [7] was chosen for this comparison as it is the lowest complex MIMO DPD found in the literature, to the best of the inventors' knowledge. Complexity analysis was carried out considering both DPD adaptation in a close loop setup and DPD execution.

In addition, the ILC per-branch DPD scheme described above works in the same way for both correlated and uncorrelated signals. This provides an advantage over conventional DPD schemes which work for one but fail for the other (see, e.g., the DPD scheme of [9] which is applicable in the case of correlated signals and fails otherwise and the ILA-based techniques which fail when signals are correlated). Correlation here is captured by means of the number of MIMO layers.

In the discussion above, MIMO DPD is performed by using per-branch ILC DPD systems. Now, the discussion will turn to some other embodiments of the present disclosure in which a combined or group combined MIMO DPD scheme is provided.

In some embodiments of the combined MIMO DPD, as an alternative to using a multivariate memory polynomial as a PA model in an AAS and then finding the inverse model using ILA, a multi-output kernel regression and ILC are used to perform DPD in a MIMO transmitter system (e.g., an AAS) in a combined or group combined manner. In a per branch DPD actuator setup, ILC is used to identify the optimal predistorted input signal for each individual PA that drives the PA output to be a linear (or near linear) function of the input signal. Using combined or group combined MIMO DPD in accordance with some embodiments of the present disclosure, input signals for all antenna branches are predistorted in a combined manner and the resulting predistorted input signals are sent to the respective antenna branches. The input signals for all antenna branches are collected into a combined input signal matrix, X. Using ILC and kernel regression, the combined DPD model is configured to produce a desired predistorted input signal matrix, U, that drives all antenna branches to produce an output signal matrix, Y, that is a linearly (or nearly linearly, e.g., as linear as possible) amplified version of X.

Using the combined MIMO DPD scheme described herein provides a number of advantages over other approaches. In contrast to other solutions, the combined MIMO DPD scheme described herein has the following advantageous:

The combined MIMO DPD scheme described herein provides reduced computational and implementation complexity compared to per branch DPD actuator solutions, and The combined MIMO DPD scheme described herein is independent of aspects like correlation among signals and wherein the radio chain signals are coupled to each other. As such, less information is required to implement the combined MIMO DPD scheme. In fact, not even the nonlinearity order is needed to be identified in advance. Only the desired memory depth is needed.

Figure 5:
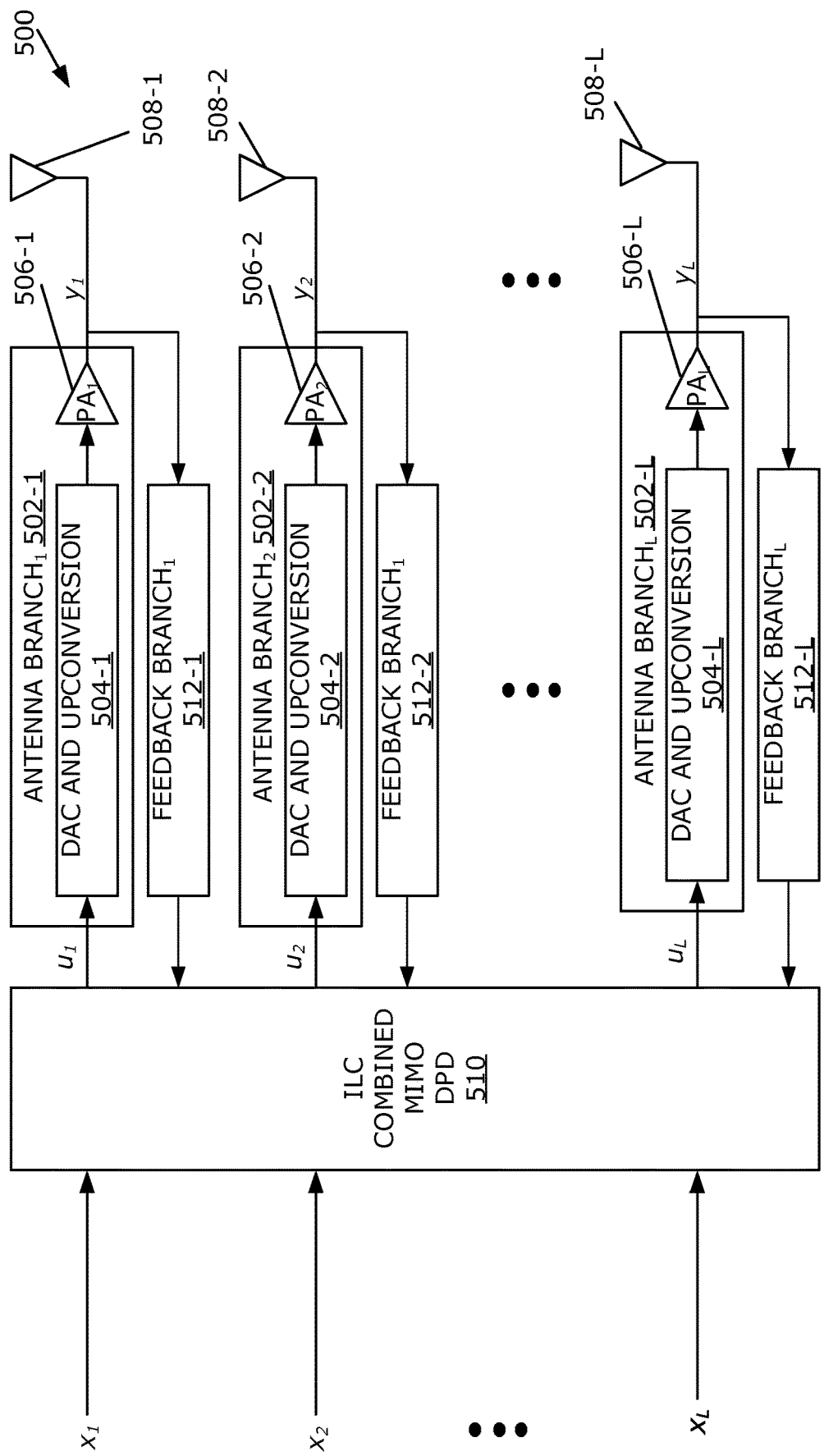
FIG. 5 illustrates an example of a MIMO transmitter that performs DPD in accordance with an ILC combined MIMO DPD scheme in accordance with some embodiments of the present disclosure.

In this regard, FIG. 5 illustrates an example of a MIMO transmitter 500 that performs DPD in accordance with an ILC combined MIMO DPD scheme in accordance with some embodiments of the present disclosure. As discussed below, the ILC combined MIMO DPD scheme uses kernel regression in some embodiments. As illustrated, the MIMO transmitter 500 includes a number of antenna branches 502-1 through 502-L, where "L" is the number of antenna branches. The antenna branches 502 may alternatively be referred to herein as "transmit branches" or "radio branches". The antenna branches 502-1 through 502-L include respective DAC and upconversion circuitry 504-1 through 504-L and respective PAs 506-1 through 506-L. The outputs of the PAs 506-1 through 506-L are coupled to respective antenna elements 508-1 through 508-L.

The MIMO transmitter 500 also includes an ILC combined MIMO DPD system 510 (also referred to herein as a "combined DPD system 510"). The combined DPD system 510 uses ILC and, in some embodiments, kernel regression to perform DPD in the MIMO transmitter 510, as described below in detail. While not illustrated, the combined DPD system 510 includes a combined DPD actuator that predistorts the input signals $x_1$ to $x_L$ for the respective antenna branches 502-1 through 502-L in a combined manner based on one or more DPD parameters (e.g., weights) for a combined MIMO DPD model for the MIMO transmitter 500, and a DPD adaptor that adaptively configures the DPD parameters based on feedback signals from the outputs of the antenna branches 502-1 through 502-L, as described below in detail. Here, the DPD adaptor uses ILC preferably with kernel regression to adaptively compute the DPD parameters, as will be described below in detail. Note that, in the embodiments described herein, there are two DPD actuators, one for amplitude and one for phase. The MIMO transmitter 500 also includes feedback branches 512-1 through 512-L having inputs coupled to the outputs of the respective antenna branches 502-1 through 502-L and outputs that provide the feedback signals to the combined DPD system 110. As will be appreciated by one of skill in the art, the feedback branches 512-1 through 512-L generally include downconversion circuitry and ADC circuitry.

In operation, the input signals $x_1$ to $x_L$ for the respective antenna branches 502-1 through 502-L are predistorted by the combined DPD system 510 based on the combined MIMO DPD model to provide respective predistorted input signals $u_1$ to $u_L$. The predistorted input signals $u_1$ to $u_L$ are then processed by the respective antenna branches 502-1 through 502-L to provide transmit signals $y_1$ to $y_L$.

FIG. 6 is a flow chart that illustrates the operation of the MIMO transmitter 500 in accordance with some embodiments of the present disclosure. As illustrated, the combined DPD system 510 determines one or more DPD model parameters for a combined MIMO DPD model for the L antenna branches 502-1 through 502-L (e.g., using ILC with kernel regression) (step 600). Thus, the MIMO transmitter 500 is said to perform combined MIMO DPD, e.g., using ILC with kernel regression. The combined DPD system 510 predistorts the input signals $x_1$ to $x_L$ for the respective antenna branches 502-1 through 502-L to provide respective predistorted input signals $u_1$ to $u_L$ for the antenna branches 502-1 through 502-L based on the determined DPD model parameters for the combined MIMO DPD model (step 602).

Figure 7:
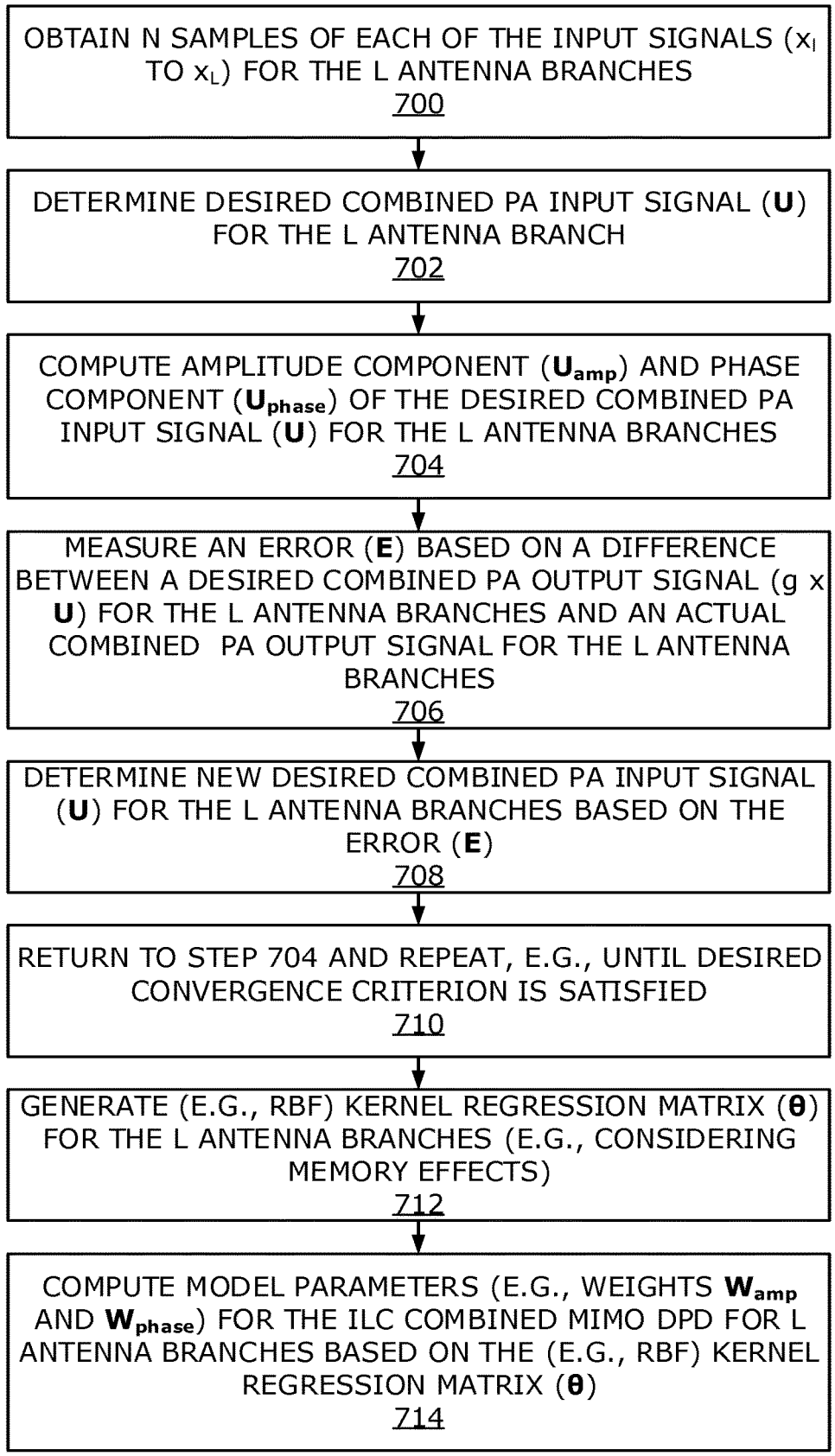
FIG. 7 is a flow chart that illustrates the operation of the combined DPD system of the MIMO transmitter of FIG. 5 in accordance with some embodiments of the present disclosure.
Figure 8:
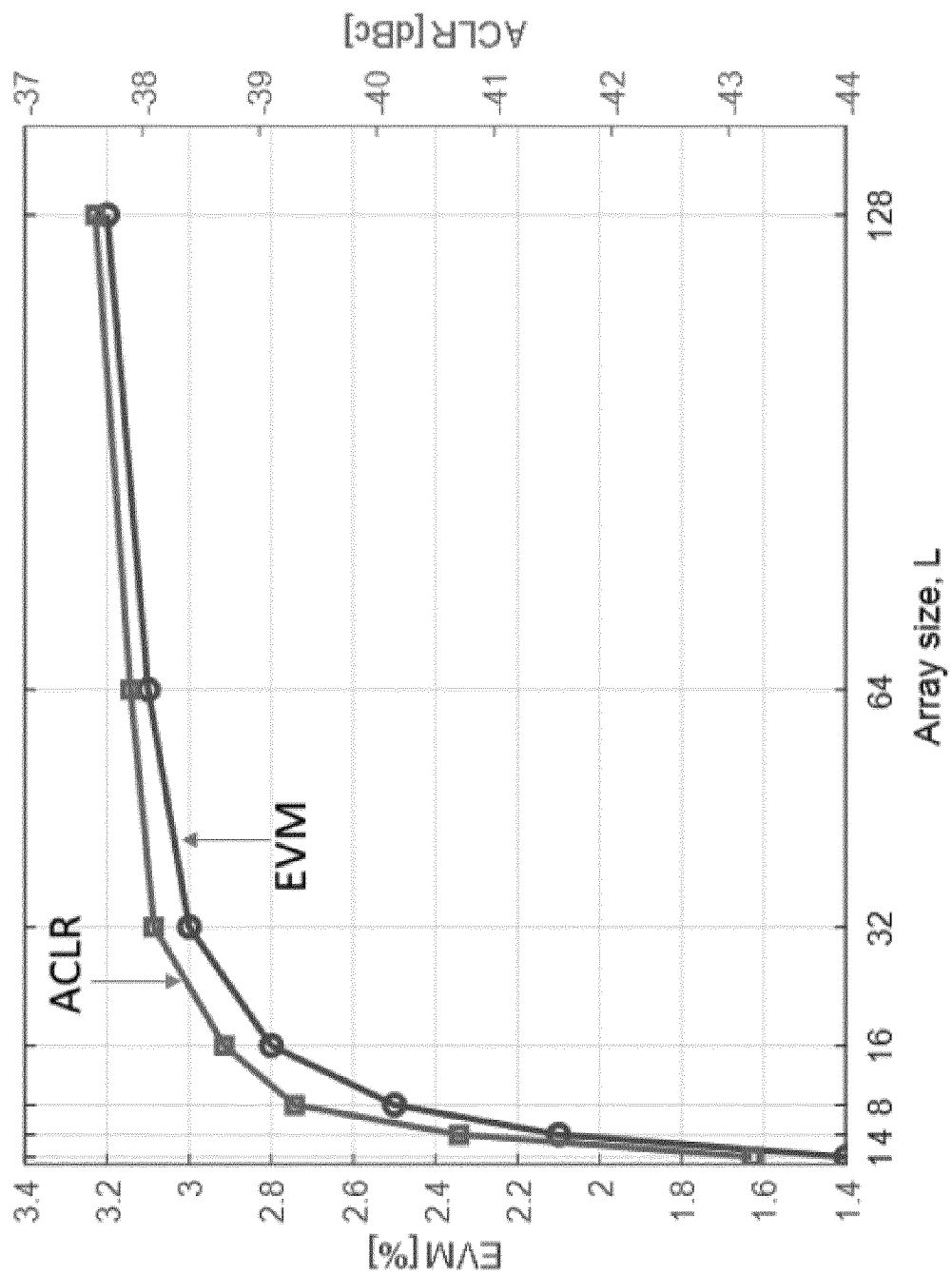
FIGS. 8 through 11 illustrate simulation results for one example implementation of the combined MIMO DPD scheme utilized by the combined DPD system described with respect to FIGS. 5 and 7.
Figure 9:
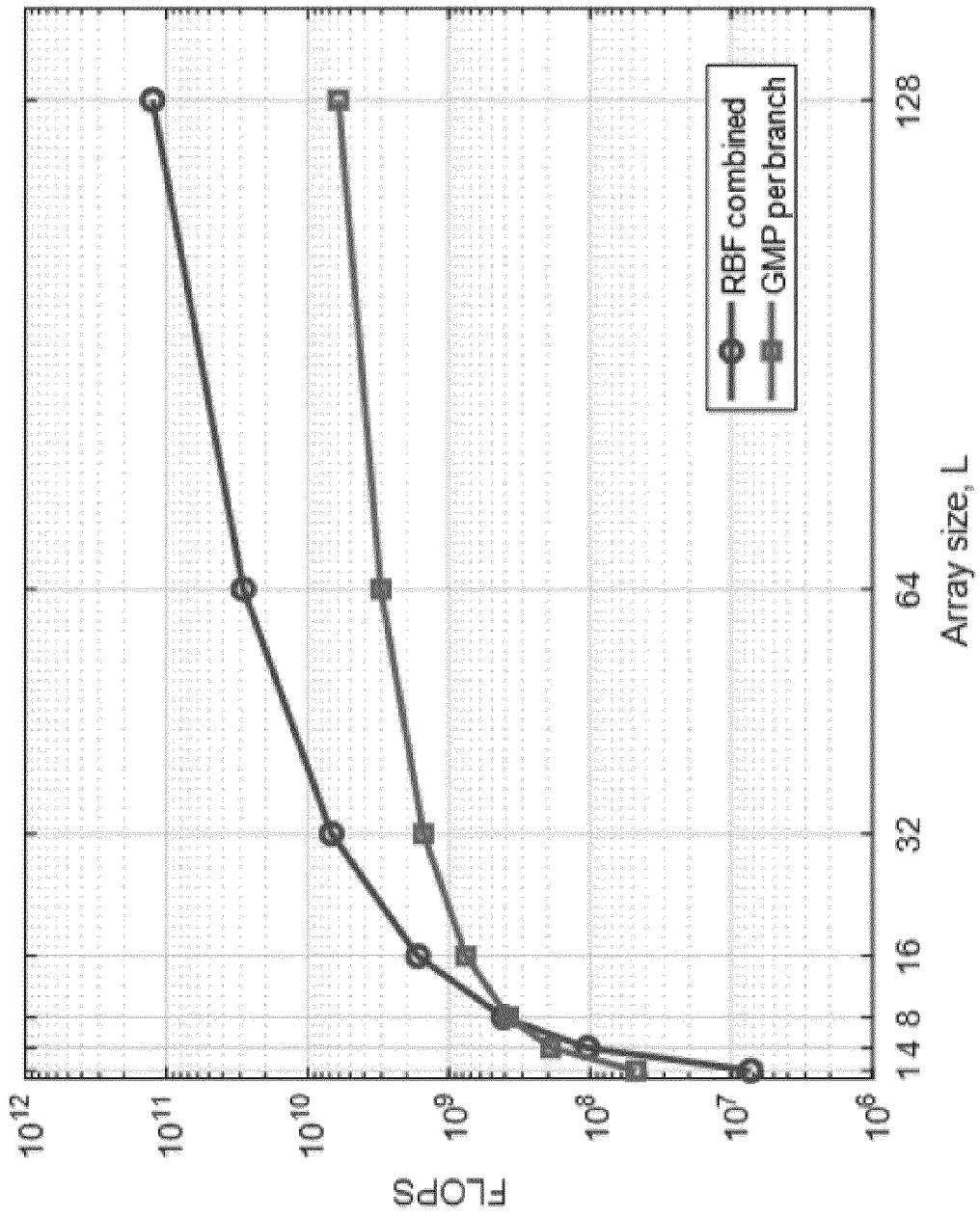
Figure 10:
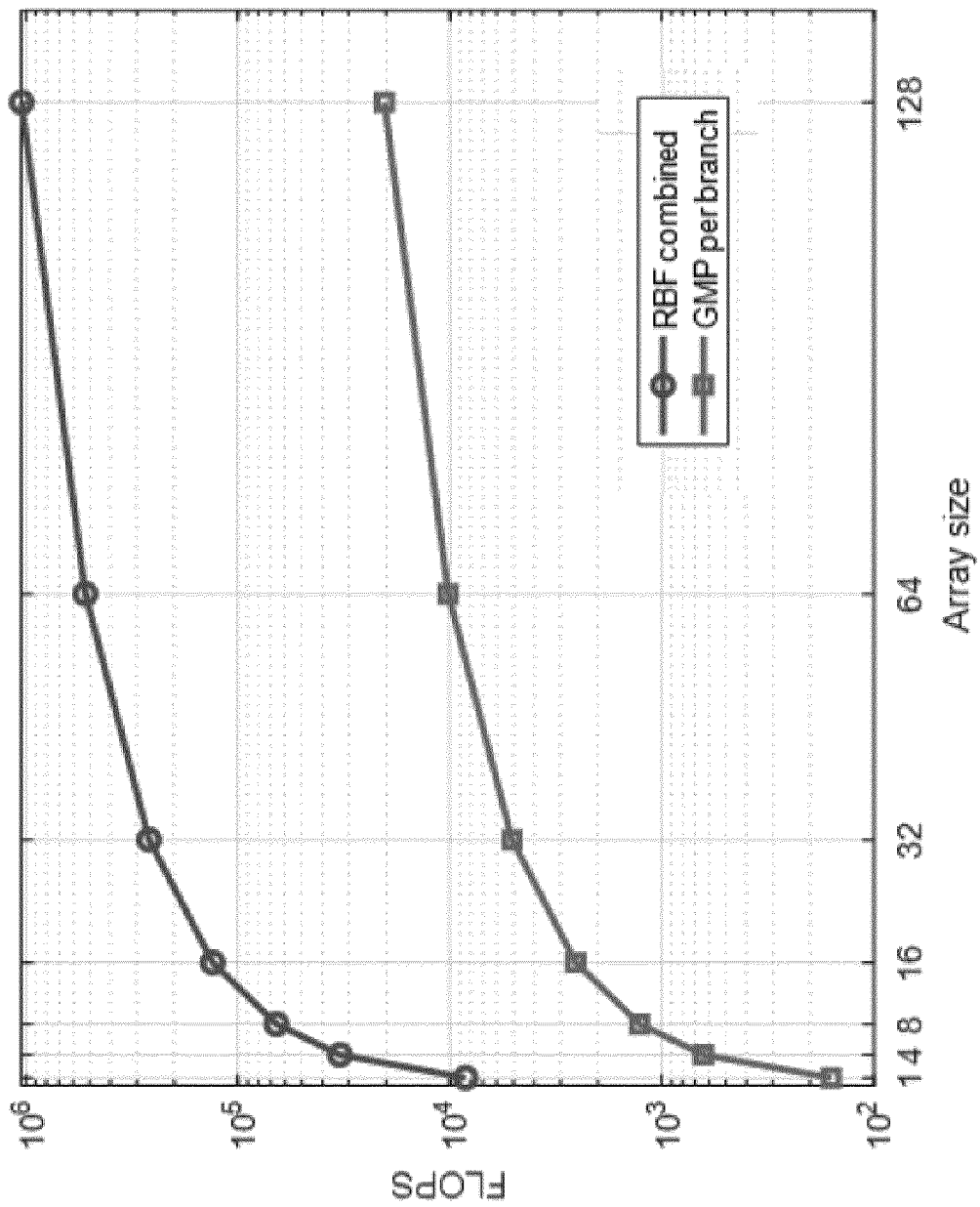
Figure 11:
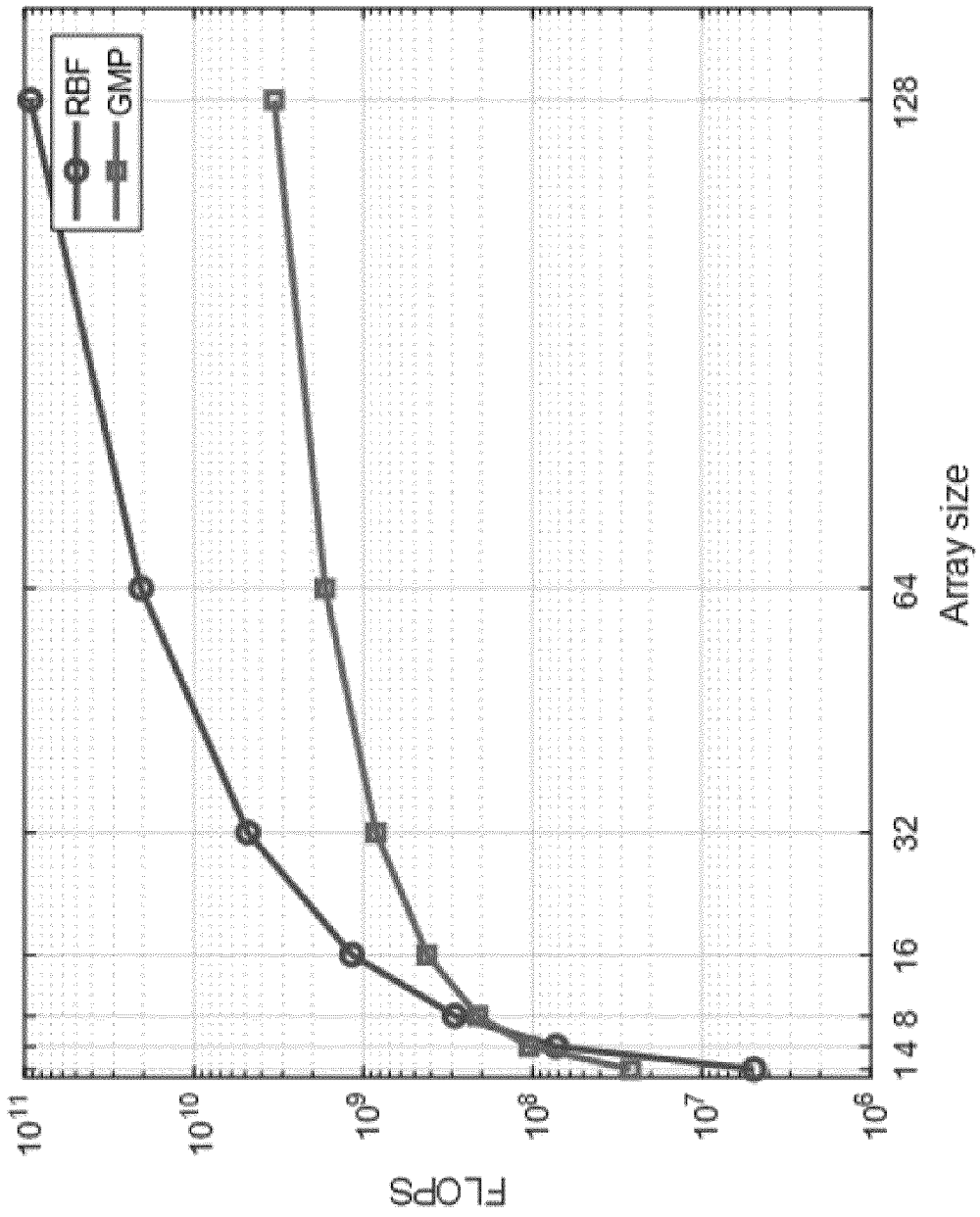

FIG. 7 is a flow chart that illustrates the operation of the combined DPD system 510 in accordance with some embodiments of the present disclosure. In particular, this process can be understood as being details for one embodiment of step 600 of FIG. 6. Note that while the term "steps" is used, these "steps" (or actions) may be performed in any suitable order unless otherwise required and, in some implementations, some of the steps may be performed concurrently.

As illustrated, the combined DPD system 510 obtains N input samples of each of the input signals $x_1$ to $x_L$ for the L antenna branches 502-1 through 502-L (step 700). This collection of input samples can be expressed as an input signal matrix X as follows:

$$X = \begin{bmatrix} x_1(1) & \cdots & x_L(1) \\ \vdots & \ddots & \vdots \\ x_1(N) & \cdots & x_L(N) \end{bmatrix}$$

where $x_l(n)$ denotes an n-th sample of the input signal $x_l$ for the l-th antenna branch 502-$l$.

As illustrated, the combined DPD system 510 determines a desired combined input signal (U) for the L antenna branches 502-1 through 502-L (step 702). In other words, the combined DPD system 510 initializes desired combined input signal (U) for the L antenna branches 502-1 through 502-L. In this example, the desired combined input signal (U) is computed as:

$$U = \frac{Y_d}{g}$$

where U is defined as:

$$U \in \mathbb{R}^{N \times L} = \begin{bmatrix} u_1(1) & \cdots & u_L(1) \\ \vdots & \ddots & \vdots \\ u_1(N) & \cdots & u_L(N) \end{bmatrix}$$

Note that $u_l(n)$ denotes an n-th sample of the desired input signal $u_l$ (i.e., the predistorted input signal) for the l-th antenna branch 502-$l$, and N is the total number of samples for each antenna branch 502. $Y_d$ is the desired combined output signal for antenna branches L antenna branches 502-1 through 502-L. In other words, $Y_d$ is the linearly amplified output signal, which can be represented as:

$$Y_d = gX.$$

The combined DPD system 510 computes an amplitude component ($U_{amp}$) and a phase component ($U_{phase}$) of the desired combined input signal (U) (step 704). The amplitude component ($U_{amp}$) and the phase component ($U_{phase}$) of the desired combined input signal (U) can be expressed as:

$$U_{amp} \in \mathbb{R}^{N \times L} = \begin{bmatrix} |u_1(1)| & \cdots & |u_L(1)| \\ \vdots & \ddots & \vdots \\ |u_1(N)| & \cdots & |u_L(N)| \end{bmatrix}$$

and $$U_{phase} \in \mathbb{R}^{N \times L} = \begin{bmatrix} \phi(u_1(1)) & \cdots & \phi(u_L(1)) \\ \vdots & \ddots & \vdots \\ \phi(u_1(N)) & \cdots & \phi(u_L(N)) \end{bmatrix}$$

Note that, here, $|u_l(n)|$ denotes an amplitude component of the n-th sample of the input signal $u_l$ for the l-th antenna branch 502-*l*, and $\phi(u_l(n))$ denotes a phase component of the n-th sample of the input signal $u_l$ for the l-th antenna branch 502-*l*.

While not illustrated in the flow chart of FIG. 7, the combined DPD system 510 then applies the desired combined input signal (U) to the antenna branches 502-1 to 502-L. Using the feedback signals from the feedback branches 512-1 to 512-L, the combined DPD system 510 measures an error (E) between: (a) the actual output signals $y_1$ to $y_L$ (represented as an actual output signal matrix Y) of the antenna branches 502-1 through 502-L resulting from the N samples of the desired combined input signal (U) and (b) desired output signals $y_{1,d}$ to $y_{L,d}$ (represented as an actual output signal matrix $Y_d$) of the antenna branches 502-1 through 502-L (step 706).

The combined DPD system 510 computes a new desired combined input signal $U_{new}$ based on the measured error (E) (step 708). In other words, the combined DPD system 510 updates desired combined input signal U based on the measured error (E). In this example, the new (i.e., update) desired input signal $U_{new}$ is computed as:

$$U_{new} = U + \varepsilon E.$$

Note that $\varepsilon$ is a constant known as the learning gain, which is equivalent to $1/g$, where "g" is the linear gain. While not necessary, further explanation regarding $\varepsilon$ can be found in [10].

The process then returns to step 704 and is repeated, e.g., until a desired convergence criterion is satisfied (e.g., repeated until the error E is within a predefined acceptable range, repeated until a defined a maximum number of iterations have been performed, or the like (step 710).

Once convergence is reached, the new desired combined input signal $U_{new}$ at that point is then determined to be the desired combined input signal. As such, this new desired combined input signal $U_{new}$ at the point of convergence is referred to as the desired combined input signal U for the reminder of the process of FIG. 7.

The combined DPD system 510 generates a kernel regression matrix $\theta$ for the L antenna branches 502-1 to 502-L (step 712). In the example embodiment here, the kernel regression matrix $\theta$ is generated in such a manner as to compensate for memory effects. For introducing the memory effects, tapped delay inputs are incorporated into the regression matrix $\theta$ by concatenating the regressors for current and past inputs, up to a predefined memory depth M, as described below. More specifically, the combined DPD system 510 generates the kernel regression matrix $\theta$ as follows:

Define vector $z(n)$ as:

$$z(n) \in \mathbb{R}^{L(M+1)} = [|x_1(n)|, |x_1(n-1)|, \ldots, |x_1(n-M)|, \ldots |x_L(n)|, \ldots, |x_L(n-M)|]$$

where M is the memory depth of the memory effects taken into account for generation of the kernel regression matrix $\theta$.

Define regressors $\theta^i \in \mathbb{R}^{N \times K}$ as:

$$\theta^i = \begin{bmatrix} \theta^i_{11} & \cdots & \theta^i_{1K} \\ \vdots & \ddots & \vdots \\ \theta^i_{N1} & \cdots & \theta^i_{NK} \end{bmatrix}$$

where $$\theta^i_{nk} = \varphi(\mu_k, z_i(n))$$

Note that kernel regression is based on the assumption that every input-output pair (or representative centroids of the input space) in the data set influences the estimation of a non-linear output corresponding to a specific input based on the Euclidian distance between the two inputs in their vector space. The representative centroids of the input space are denoted as $\mu_k$, k:1→K, where K is the number of representative centriods of the input space. In the example embodiments described herein, the Lloyd algorithm can be used to identify the centroids $\mu_k$, k:1→K. As PAs are amplitude driven devices [13], the signal amplitude support is taken as the input space, and the amplitude and phase responses are thereafter estimated individually. Also note that $z_i(n)$ denotes the i-th element of the vector $z(n)$.

In this example, RBF kernels are used. Note, however, that any other type kernel may be used (e.g., kernels based on GMP bases). Using RBF kernels, for each value of i=1, 2, ... L(M+1), elements ($\theta_{nk}{}^i$) for the i-th regressor $\theta^i$ are computed, for each value of n (where n=1, ..., N) and each value of k (where k=1, ..., K) as:

$$\theta_{nk}{}^i = \varphi(\mu_k, z_i(n)) = \exp(-\gamma_k \|\mu k - z_i(n)\|)$$

Importantly, i is the index for the vector $z(n)$ such that:

$$z_1(n) = |x_1(n)|$$
$$z_2(n) = |x_1(n-1)|$$
$$\ldots$$
$$z_{M+1}(n) = |x_1(n-M)|$$
$$\ldots$$
$$z_{L(M+1)}(n) = |x_L(n-M)|.$$

Construct the RBF kernel regression matrix $\theta$ as:

$$\theta \in \mathbb{R}^{N \times (1 + KL(M+1))} = [1_N, \theta^1, \ldots, \theta^{L(M+1)}].$$

The combined DPD system 510 computes the DPD parameters for the combined MIMO DPD model based on the kernel regression matrix $\theta$ as well as the amplitude component ($U_{amp}$) and the phase component ($U_{phase}$) of the desired combined input signal (U) (step 714). In this example, the DPD parameters are amplitude weights ($W_{amp}$) and phase weights ($W_{phase}$), which are computed using multi-output regression as:

$$W_{amp} = (\theta^T \theta)^{-1} \theta^T U_{amp}$$

and $$W_{phase} = (\theta^T \theta)^{-1} \theta^T U_{phase}.$$

where the total number of parameters for the whole combined MIMO DPD model (amplitude and phase) is:

$$\#parameters = 2((1+LK(M+1)) \times L).$$

Note that the elements of $W_{amp}$ are denoted as:
- $w_{1,l}$ which are the amplitude bias term for the l-th antenna branch 502-l,
- $w_{1+i(M+1),l}$ which are amplitude response to antenna branch i direct input, and
- the other elements of $W_{amp}$ are the amplitude responses to current and past values of different antenna branch inputs.

Likewise, the elements of $W_{phase}$ are denoted as:
- $w_{1,l}$ which are the phase bias term for the l-th antenna branch 502-l,
- $w_{1+i(M+1),l}$ which are phase response to antenna branch i direct input, and
- the other elements of $W_{amp}$ are the phase responses to current and past values of different antenna branch inputs.

While not illustrated in the flow chart of FIG. 7, the combined DPD system 510 then applies the computed weights $W_{amp}$ and $W_{phase}$ when predistorting samples of each of the input signals $x_1$ to $x_L$ to provide respective samples of the predistorted input signals $u_1$ to $u_L$, which are then processed by the respective antenna branches 502-1 to 502-L to output the transmits signal $y_1$ to $y_L$.

Note that the process of FIG. 7 finds U, and as such gives the corresponding desired predistorted input signals for the samples of the input signals that linearize the PAs 506-l through 506-L. It is too computationally expensive to perform the linearization on a sample by sample level; instead, U is modeled as a function of the input samples, and this is what is referred to herein as "ILC combined DPD".

Note that for kernel decaying parameters, $\gamma_k, k:1 \rightarrow K$, optimization, Expectation Maximization (EM) can be used to jointly optimize these decaying parameters and the amplitude and phase weights. Gradient descent is used to update $\gamma_k, k:1 \rightarrow K$. Further details and more explanation on this matter is available in [14].

FIGS. 8 through 11 illustrate simulation results for one example implementation of the combined MIMO DPD scheme described above with respect to FIGS. 5 and 7. These simulation results show DPD performance in terms of Adjacent Channel Leakage Ratio (ACLR), Error Vector Magnitude (EVM), and the number of FLOPS. The simulation results reveal that:

Performance: The smaller the antenna array size, L, the better the combined MIMO DPD performance measured in ACLR and EVM. The reason here is that less coupling is introduced in smaller arrays and regression matrices with smaller dimensions are used for kernel regression.

Complexity: With the increase of the antenna array size, L, the complexity of the combined MIMO DPD measured in FLOPS increases dramatically.

Moreover, in comparison with DI-PA GMP based DPD introduced in [7], the following remarks regarding implementation and scalability can be made:

Implementation: For combined MIMO DPD using ILC and kernel regression, there are always two DPD actuators (one for the amplitude and one for the phase). On the other hand, for DI-PA GMP, the number of DPD actuators is equivalent to the number of branches, L.

Scalability: DI-PA GMP is more scalable than combined MIMO-DPD using ILC and kernel regression.

Next, an "in-between solution" is proposed herein where not all antenna branches are combined but per-branch DPD is also not used. This "in-between solution" is referred to herein as a grouped combined MIMO DPD where the antenna branches are grouped into a number of groups (preferably the number of groups is greater than 1 and less than L) where each group of antenna branches has its own DPD system. In some embodiments, for each group of antenna branches, the respective DPD system uses ILC and kernel regression, as described below in detail.

Figure 12:
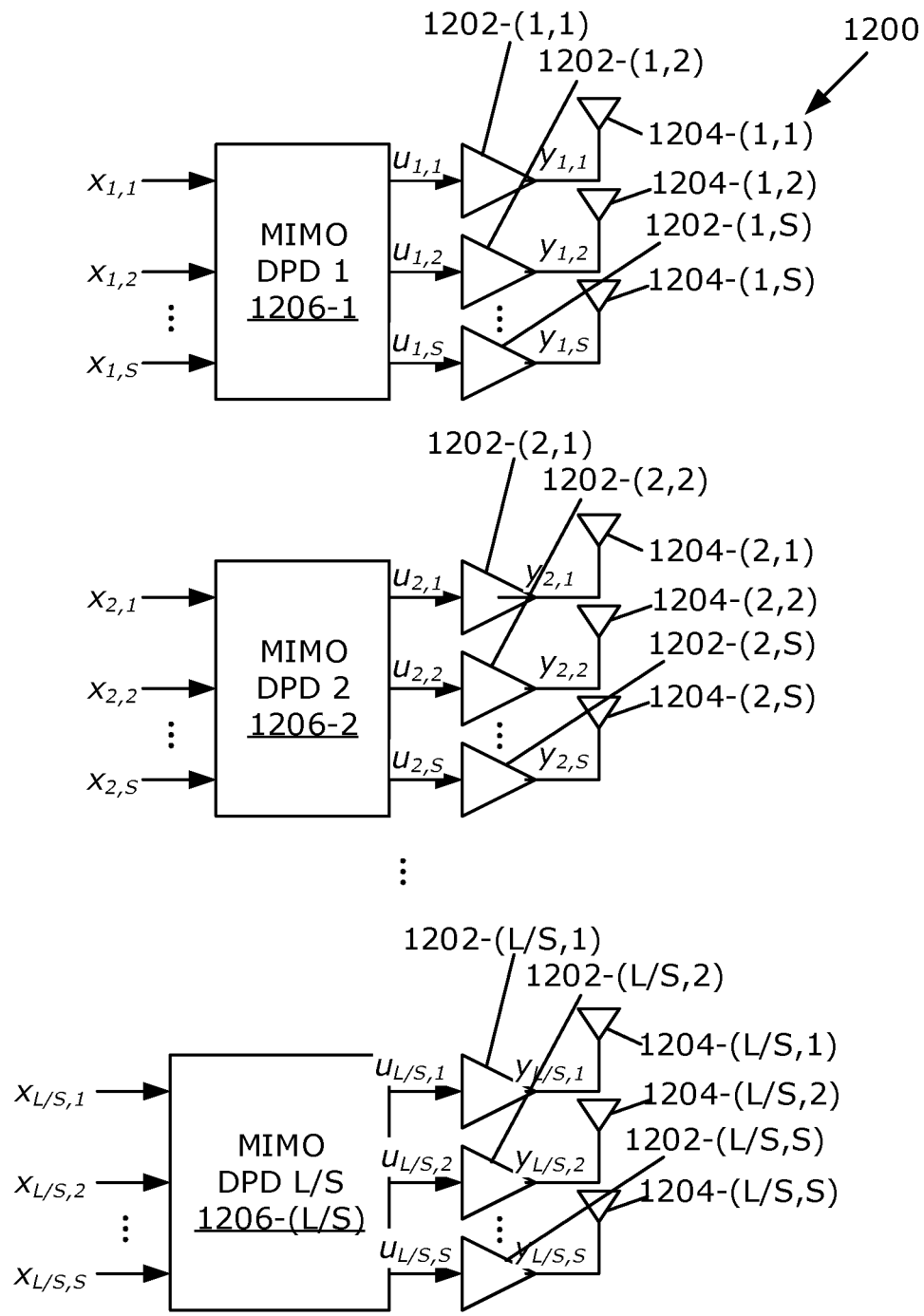
FIG. 12 illustrates an example of a MIMO transmitter that performs DPD in accordance with a group combined DPD scheme in accordance with some embodiments of the present disclosure.

In this regard, FIG. 12 illustrates an example of a MIMO transmitter 1200 that performs DPD in accordance with a group combined DPD scheme in accordance with some embodiments of the present disclosure. As discussed below, in some embodiments, the group combined MIMO DPD scheme uses ILC and possibly kernel regression to perform combined MIMO DPD for each of a number of groups of antenna branches. As illustrated, the MIMO transmitter 1200 includes a number (L) of antenna branches. The antenna branches may alternatively be referred to herein as "transmit branches" or "radio branches". The antenna branches are grouped into a number of groups or sets. In this example, each group has the same number of antenna branches, which is denoted S. Note, however, that this is an example. Different groups may include different numbers of antenna branches. When the number of groups of antenna branches is greater than 1, then the groups are disjoint subsets of the antenna branches. Preferably, the number of groups (L/S) is greater than 1 and less than L.

The antenna branches are, for clarity, represented by respective PAs 1202-(1,1) through 1202-(L/S,S). Note, however, that the antenna branches include additional circuitry such as, for example, respective DAC and upconversion circuitry. The outputs of the PAs 1202-(1,1) through 1202-(L/S,S) are coupled to respective antenna elements 1204-(1,1) through 1204-(L/S,S). Note that the reference numerals for the PAs (and the respective input signals, output signals, and antennas) use the notation (A,B) where "A" is the index of the group and "B" is the index of the PA/input signal/output signal within the group.

The MIMO transmitter 1200 also includes combined MIMO DPD systems 1206-1 through 1206-(L/S) for the respective groups of antenna branches. In other words, the MIMO transmitter 1200 includes a combined MIMO DPD system 1206 for each group of antenna branches that performs combined MIMO DPD for that group of antenna branches. While each combined MIMO DPD system 1206 may utilize any desired combined MIMO DPD scheme, in some embodiments, each combined MIMO DPD system 1206 uses ILC and, in some embodiments, kernel regression to perform combined DPD for the respective group of antenna branches, as described below in detail. While not illustrated, each s-th group of antenna branches (where s: 1→L/S), the s-th combined MIMO DPD system 1206-s includes a combined DPD actuator that predistorts the input signals $x_{s,1}$ to $x_{s,S}$ for the respective group of antenna branches in a combined manner based on one or more DPD parameters (e.g., weights) for a combined MIMO DPD model for the respective group of antenna branches, and a DPD adaptor that adaptively configures the DPD parameters based on feedback signals from the outputs of the respective group of antenna branches, as described below in detail. In some embodiments, the DPD adaptor uses ILC preferably with kernel regression to adaptively compute the DPD parameters, as will be described below in detail. Note that, in the embodiments described herein, there are two DPD actuators in the s-th DPD combined MIMO DPD system 1206-s, one for amplitude and one for phase. The MIMO transmitter 1200 also includes feedback branches (not shown for clarity) having inputs coupled to the outputs of the respective antenna branches and outputs that provide the feedback signals to the respective combined MIMO DPD systems 1206. As will be appreciated by one of skill in the art, the feedback branches generally include downconversion circuitry and ADC circuitry.

In operation, for each s-th group of antenna branches (where s:1→L/S), the input signals $x_{s,1}$ to $x_{s,S}$ for the s-th group of antenna branches are predistorted by the s-th combined MIMO DPD system 1206-s based on a combined MIMO DPD model for the s-th group of antenna branches to provide respective predistorted input signals $u_{s,1}$ to $u_{s,S}$. The predistorted input signals $u_{s,1}$ to $u_{s,S}$ are then processed by the respective antenna branches (as represented in FIG. 12 by the respective PAs 1202-(s,1) through 1202-(s,S)) to provide transmit signals $y_{s,1}$ to $y_{s,S}$ for the s-th group of antenna branches.

FIG. 13 is a flow chart that illustrates the operation of the MIMO transmitter 1200 in accordance with some embodiments of the present disclosure. As illustrated, for each s-th group of antenna branches, the combined MIMO DPD system 1206-s for the s-th group of antenna branches determines one or more DPD model parameters for a combined MIMO DPD model for the s-th group of antenna branches (e.g., using ILC with kernel regression) (step 1300). Thus, the MIMO transmitter 1200 is said to perform group combined MIMO DPD, e.g., using ILC with kernel regression. The combined MIMO DPD systems 1206-s for the s-th group of antenna branches predistorts the input signals $x_{s,1}$ to $x_{s,S}$ for the s-th group of antenna branches using the combined DPD model for the s-th group of antenna branches and the determined DPD parameters to provide predistorted input signals $u_{s,1}$ to $u_{s,S}$ for the s-th group of antenna branches (step 1302).

Figure 14:
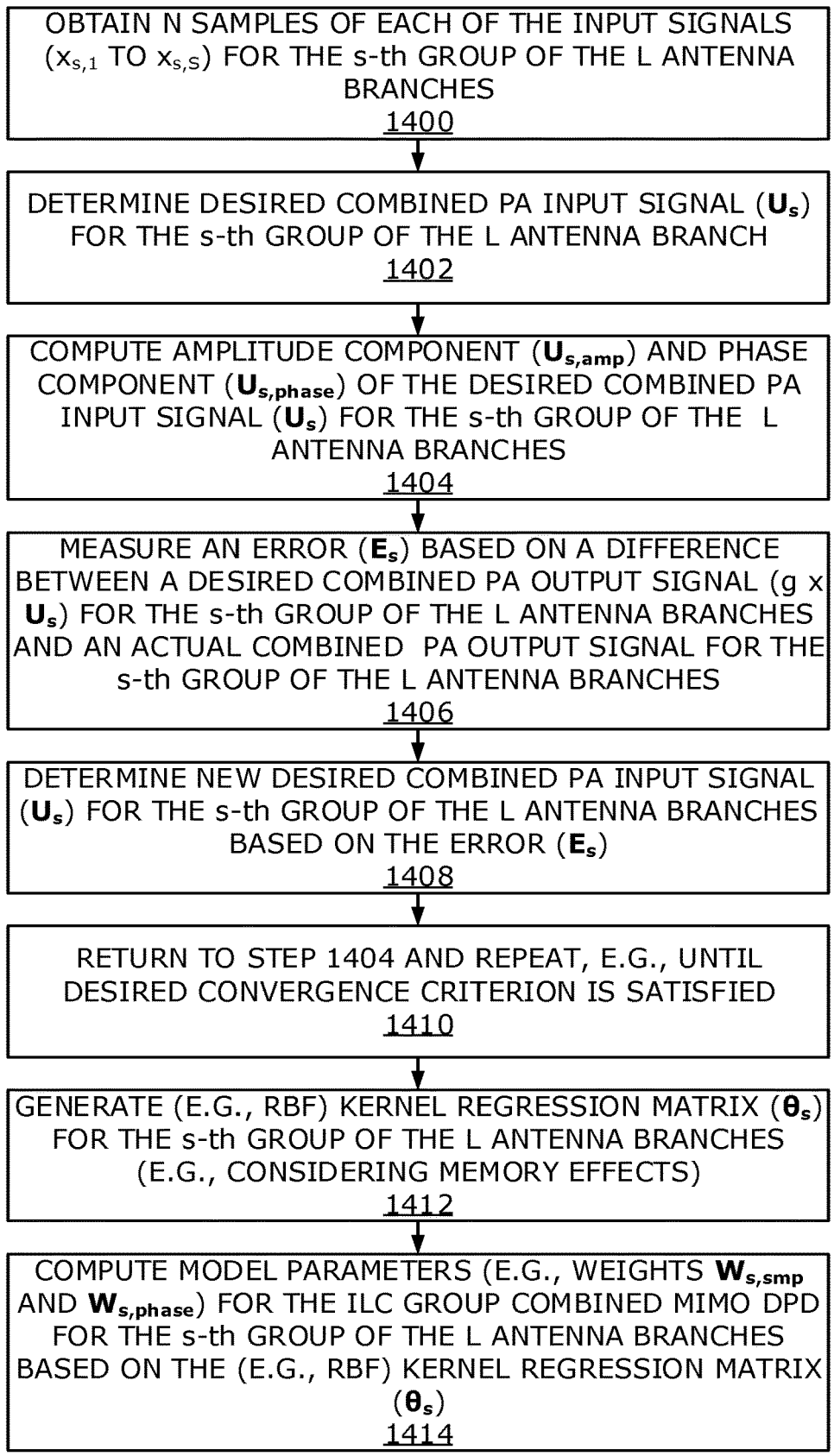
FIG. 14 is a flow chart that illustrates the operation of the s-th combined DPD system for the s-th group of antenna branches in the MIMO transmitter of FIG. 12 in accordance with some embodiments of the present disclosure.

FIG. 14 is a flow chart that illustrates the operation of the s-th combined MIMO DPD system 1206-s for the s-th group of antenna branches in the MIMO transmitter 1200 of FIG. 12 in accordance with some embodiments of the present disclosure. In particular, this process can be understood as being details for one embodiment of step 1300 of FIG. 13. Note that while the term "steps" is used, these "steps" (or actions) may be performed in any suitable order unless otherwise required and, in some implementations, some of the steps may be performed concurrently.

As illustrated, the combined MIMO DPD system 1206-s for the s-th group of antenna branches obtains N input samples of each of the input signals $x_{s,1}$ to $x_{s,S}$ for the S antenna branches in the s-th group of antenna branches (step 1400). This collection of input samples can be expressed as an input signal matrix $X_s$ as follows:

$$X_s = \begin{bmatrix} x_{s,1}(1) & \cdots & x_{s,S}(1) \\ \vdots & \ddots & \vdots \\ x_{s,1}(N) & \cdots & x_{s,S}(N) \end{bmatrix}$$

where $x_{s,1}(n)$ denotes an n-th sample of the input signal $x_{s,1}$ for the first antenna branch in the s-th group of antenna branches, $x_{s,2}(n)$ denotes an n-th sample of the input signal $x_{s,2}$ for the second antenna branch in the s-th group of antenna branches, etc.

The combined MIMO DPD system 1206-s for the s-th group of antenna branches determines a desired combined input signal ($U_s$) for the s-th group of antenna branches (step 1402). In other words, the combined MIMO DPD system 1206-s for the s-th group of antenna branches initializes the desired combined input signal ($U_s$) for the s-th group of antenna branches. In this example, the desired combined input signal ($U_s$) for the s-th group of antenna branches is computed as:

$$U_s = \frac{Y_{s,d}}{g}$$

where $U_s$ is defined as:

$$U_s \in \mathbb{R}^{N \times S} = \begin{bmatrix} u_{s,1}(1) & \cdots & u_{s,S}(1) \\ \vdots & \ddots & \vdots \\ u_{s,1}(N) & \cdots & u_{s,S}(N) \end{bmatrix}$$

Note that $u_{s,1}(n)$ denotes an n-th sample of the desired input signal $u_{s,1}$ (i.e., the predistorted input signal) for the first antenna branch in the s-th group of antenna branches, $u_{s,2}(n)$ denotes an n-th sample of the desired input signal $u_{s,2}$ (i.e., the predistorted input signal) for the second antenna branch in the s-th group of antenna branches, etc. Also, N is the total number of samples for each antenna branch in the s-th group of antenna branches. $Y_{s,d}$ is the desired combined output signal for the s-th group of antenna branches. In other words, $Y_{s,d}$ is the linearly amplified output signal, which can be represented as:

$$Y_{s,d} = g X_s.$$

The combined MIMO DPD system 1206-s for the s-th group of antenna branches computes an amplitude component ($U_{s,amp}$) and a phase component ($U_{s,phase}$) of the desired combined input signal ($U_s$) for the s-th group of antenna branches (step 1404). The amplitude component ($U_{s,amp}$) and the phase component ($U_{s,phase}$) of the desired combined input signal ($U_s$) for the s-th group of antenna branches can be expressed as:

$$U_{s,amp} \in \mathbb{R}^{N \times S} = \begin{bmatrix} |u_{s,1}(1)| & \cdots & |u_{s,S}(1)| \\ \vdots & \ddots & \vdots \\ |u_{s,1}(N)| & \cdots & |u_{s,S}(N)| \end{bmatrix}$$

and $$U_{s,phase} \in \mathbb{R}^{N \times S} = \begin{bmatrix} \phi(u_{s,1}(1)) & \cdots & \phi(u_{s,S}(1)) \\ \vdots & \ddots & \vdots \\ \phi(u_{s,1}(N)) & \cdots & \phi(u_{s,S}(N)) \end{bmatrix}$$

Note that, here, $|u_{s,1}(n)|$ denotes an amplitude component of the n-th sample of the input signal $u_{s,1}$ for the first antenna branch in the s-th group of antenna branches, $|u_{s,2}(n)|$ denotes an amplitude component of the n-th sample of the input signal $u_{s,2}$ for the second antenna branch in the s-th group of antenna branches, etc. Likewise, $\phi(u_{s,1}(n))$ denotes a phase component of the n-th sample of the input signal $u_{s,1}$ for the first antenna branch in the s-th group of antenna branches, $\phi(u_{s,2}(n))$ denotes a phase component of the n-th sample of the input signal $u_{s,2}$ for the second antenna branch in the s-th group of antenna branches, etc.

While not illustrated in the flow chart of FIG. 14, the combined MIMO DPD system 1206-s for the s-th group of antenna branches then applies the desired combined input signal ($U_s$) to the s-th group of antenna branches. Using the feedback signals from the feedback paths for the s-th group of antenna branches, the combined MIMO DPD system 1206-s measures an error ($E_s$) between: (a) the actual output signals $y_{s,1}$ to $y_{s,S}$ for the s-th group of antenna branches (represented as an actual output signal matrix $Y_s$) of the antenna branches in the s-th group of antenna branches resulting from the desired combined input signal ($U_s$) and (b) desired output signals $y_{s,1,d}$ to $y_{s,S,d}$ of the s-th group of antenna branches (represented as an actual output signal matrix $Y_{s,d}$) (step 1406).

The combined MIMO DPD system 1206-s for the s-th group of antenna branches computes a new desired combined input signal $U_{s,new}$ for the s-th group of antenna branches based on the measured error ($E_s$) for the s-th group of antenna branches (step 1408). In other words, the combined MIMO DPD system 1206-s for the s-th group of antenna branches updates the desired combined input signal $U_s$ for the s-th group of antenna branches based on the measured error ($E_s$) for the s-th group of antenna branches. In this example, the new (i.e. updated) desired input signal $U_{new}$ for the s-th group of antenna branches is computed as:

$$U_{s,new} = U_s + \varepsilon E_s.$$

Note that $\varepsilon$ is a constant known as the learning gain, which is equivalent to 1/g, where "g" is the linear gain. While not necessary, further explanation regarding $\varepsilon$ can be found in [10].

The process then returns to step 1404 and is repeated, e.g., until a desired convergence criterion is satisfied (e.g., repeated until the error $E_s$ is within a predefined acceptable range, repeated until a defined a maximum number of iterations have been performed, or the like) (step 1410).

Once convergence is reached, the new desired combined input signal $U_{s,new}$ for the s-th group of antenna branches at that point is then determined to be the desired combined input signal for the s-th group of antenna branches. As such, this new desired combined input signal $U_{s,new}$ for the s-th group of antenna branches at the point of convergence is referred to as the desired combined input signal $U_s$ for the s-th group of antenna branches for the reminder of the process of FIG. 14.

The combined MIMO DPD system 1206-s for the s-th group of antenna branches generates a kernel regression matrix $\theta_s$ for the S antenna branches in the s-th group of antenna branches (step 1412). In the example embodiment here, the kernel regression matrix $\theta_s$ is generated in such a manner as to compensate for memory effects. For introducing the memory effects, tapped delay inputs are incorporated into the regression matrix $\theta_s$ by concatenating the regressors for current and past inputs, up to a predefined memory depth M, as described below. More specifically, the combined MIMO DPD system 1206-s for the s-th group of antenna branches generates the kernel regression matrix $\theta_s$ as follows:

Define vector $z_s(n)$ as:
$$z_s(n) \in \mathbb{R}^{S(M+1)} = [|x_{s,1}(n)|, |x_{s,1}(n-1)|, \ldots, |x_{s,1}(n-M)|, \ldots, |x_{s,S}(n)|, \ldots, |x_{s,S}(n-M)|]$$

where M is the memory depth of the memory effects taken into account for generation of the kernel regression matrix $\theta_s$.

Define regressors $\theta_s^i \in \mathbb{R}^{N \times K}$ as:

$$\theta_s^i = \begin{bmatrix} \theta_{s,11}^i & \cdots & \theta_{s,1K}^i \\ \vdots & \ddots & \vdots \\ \theta_{s,N1}^i & \cdots & \theta_{s,NK}^i \end{bmatrix}$$

where $$\theta_{s,nk}^i = \varphi(\mu_k, z_{s,i}(n)).$$

Note that kernel regression is based on the assumption that every input-output pair (or representative centroids of the input space) in the data set influences the estimation of a non-linear output corresponding to a specific input based on the Euclidian distance between the two inputs in their vector space. The representative centroids of the input space are denoted as $\mu_k$, k:1→K, where K is the number of representative centroids of the input space. In the example embodiments described herein, the Lloyd algorithm can be used to identify the centroids $\mu_k$, k:1→K. As PAs are amplitude driven devices [14], the signal amplitude support is taken as the input space, and the amplitude and phase responses are thereafter estimated individually. Also note that $z_{s,i}(n)$ denotes the i-th element of the vector $z_s(n)$.

In this example, RBF kernels are used. Note, however, that any other type kernel may be used (e.g., kernels based on GMP bases). Using RBF kernels, for each value of i=1,2, ... S(M+1), elements ($\theta_{s,nk}^i$) for the i-th regressor $\theta_s^i$ are computed, for each value of n (where n=1, ..., N) and each value of k (where k=1, ..., K) as:

$$\theta_{s,nk}^i = \varphi(\mu_k, z_{s,i}(n)) = \exp(-\gamma_k \| \mu_k - z_{s,i}(n) \|)$$

Importantly, i is the index for the vector z(n) such that:

$$z_{s,1}(n) = |x_{s,1}(n)|$$
$$z_{s,2}(n) = |x_{s,1}(n-1)|$$
$$\ldots$$
$$z_{s,M+1}(n) = |x_{s,1}(n-M)|$$
$$\ldots$$
$$z_{S(M+1)}(n) = |x_{s,S}(n-M)|.$$

Construct the RBF kernel regression matrix $\theta_s$ as:

$$\theta_s \in \mathbb{R}^{N \times (1+KS(M+1))} = [1_N, \theta^1, \ldots, \theta^{S(M+1)}].$$

The combined MIMO DPD system 1206-s for the s-th group of antenna branches computes the DPD parameters for the combined MIMO DPD model for the s-th group of antenna branches based on the kernel regression matrix $\theta_s$ as well as the amplitude component ($U_{s,amp}$) and the phase component ($U_{s,phase}$) of the desired combined input signal ($U_s$) for the s-th group of antenna branches (step 1414). In this example, the DPD parameters are amplitude weights ($W_{s,amp}$) and phase weights ($W_{s,phase}$), which are computed using multi-output regression as:

$$W_{s,amp} = (\theta_s^T \theta)^{-1} \theta_s^T U_{s,amp}$$

and $$W_{s,phase} = (\theta_s^T \theta)^{-1} \theta_s^T U_{s,phase}.$$

where the total number of parameters for the whole combined MIMO DPD model (amplitude and phase) for the s-th group of antenna branches is:

$$\text{\#parameters} = 2((1+SK(M+1)) \times S).$$

Note that the elements of $W_{s,amp}$ are denoted as:

$w_{s,1,l}$ which are the amplitude bias term for the l-th antenna branch in the s-th group of antenna branches, $w_{s,1+l(M+1),l}$ which are amplitude response to antenna branch i direct input, and the other elements of $W_{s,amp}$ are the amplitude responses to current and past values of different antenna branch inputs in the s-th group of antenna branches.

Likewise, the elements of $W_{s,phase}$ are denoted as:

$w_{s,1,l}$ which is the phase bias term for the l-th antenna branch in the s-th group of antenna branches, $w_{s,1+l(M+1),l}$ which is phase response to antenna branch i direct input, and the other elements of $W_{s,amp}$ are the phase responses to current and past values of different antenna branch inputs in the s-th group of antenna branches.

While not illustrated in the flow chart of FIG. 14, the combined MIMO DPD system 1206-s for the s-th group of antenna branches then applies the computed weights $W_{s,amp}$ and $W_{s,phase}$ when predistorting samples of each of the input signals $x_{s,1}$ to $x_{s,S}$ to provide respective samples of the predistorted input signals $u_{s,1}$ to $u_{s,S}$ for the s-th group of antenna branches, which are then processed by the respective antenna branches to output the transmits signal $y_{s,1}$ to $y_{s,S}$ for the s-th group of antenna branches.

Note that the process of FIG. 14 finds $U_s$, and as such gives the corresponding desired predistorted input signals for the samples of the input signals that linearize the PAs 1202-(s,1) through 1202-(s,S) for the s-th group of antenna branches. It is too computationally expensive to perform the linearization on a sample by sample level; instead, $U_s$ is modeled as a function of the input samples, and this is what is referred to herein as "ILC combined DPD".

Note that for kernel decaying parameters, $\gamma_k, k:1 \to K$, optimization, EM can be used to jointly optimize these decaying parameters and the amplitude and phase weights. Gradient descent is used to update $\gamma_k, k: 1 \to K$. Further details and more explanation on this matter is available in [14].

The group combined MIMO DPD illustrated in FIGS. 12 and 14 and described above provides an advantage over conventional MIMO DPD schemes by providing a good compromise between performance, computational complexity, implementation complexity, and scalability.

Figure 15:
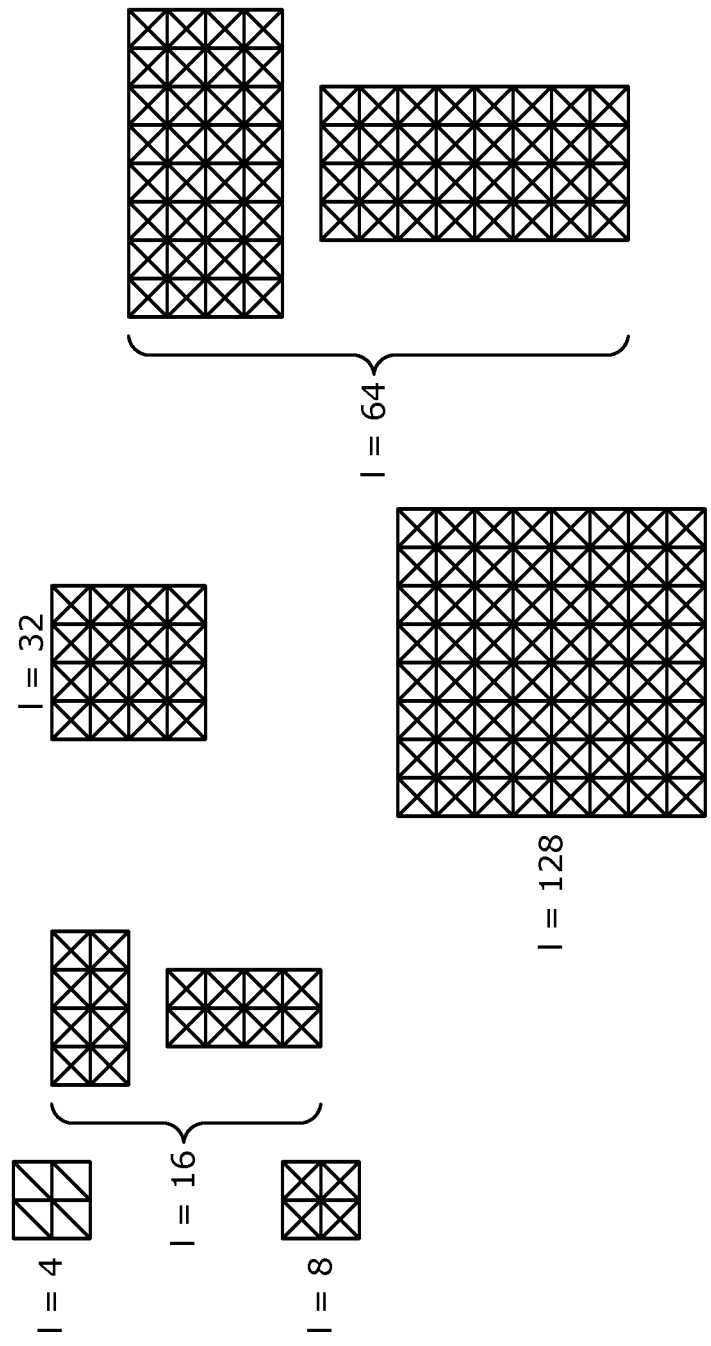
FIG. 15 illustrates some example antenna branch groupings for a dual-polarized antenna array having 64 antenna elements for each polarization.
Figure 16:
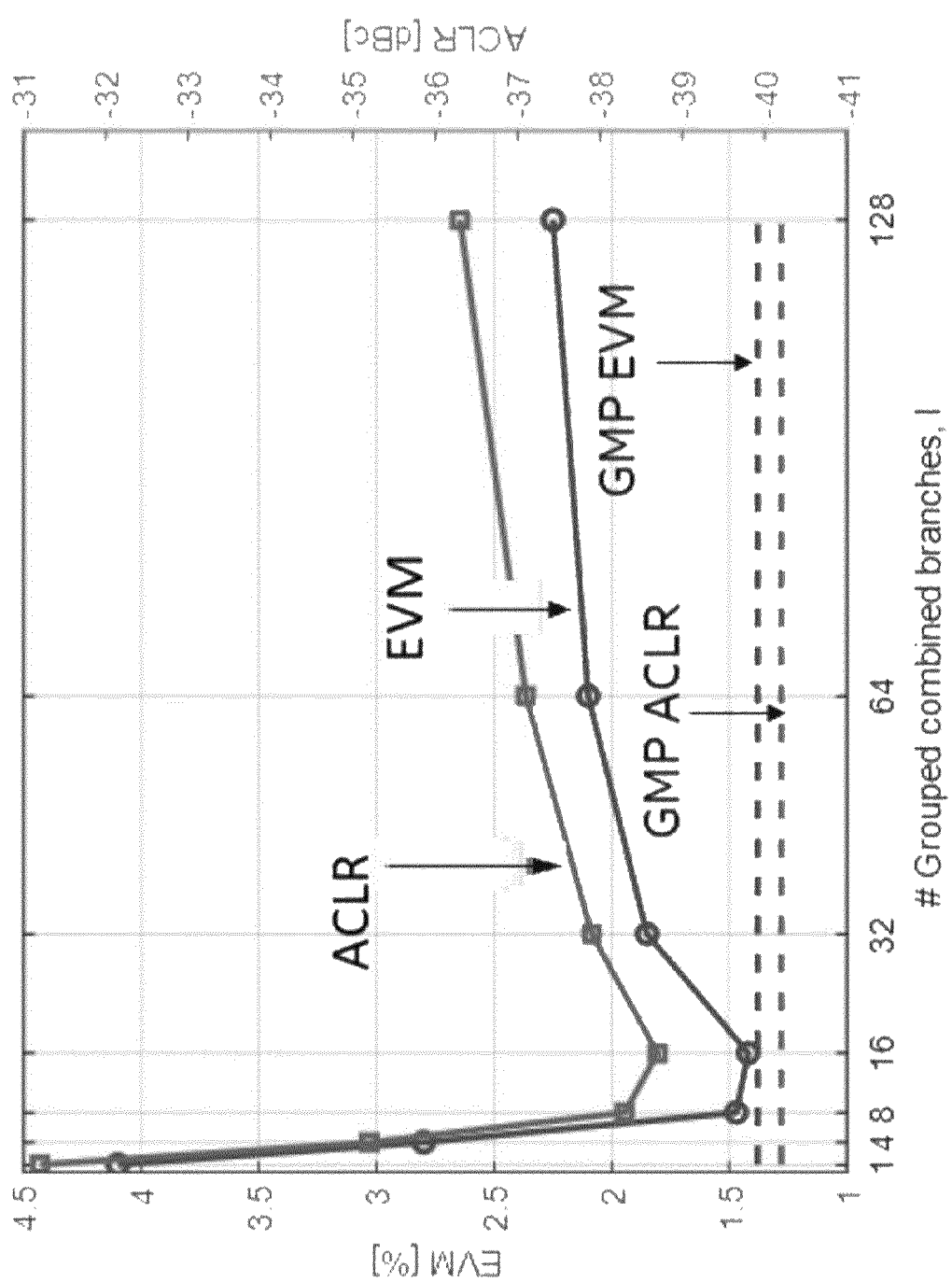
FIGS. 16 and 17 illustrate simulation results for one particular implementation of group combined MIMO DPD.
Figure 17:
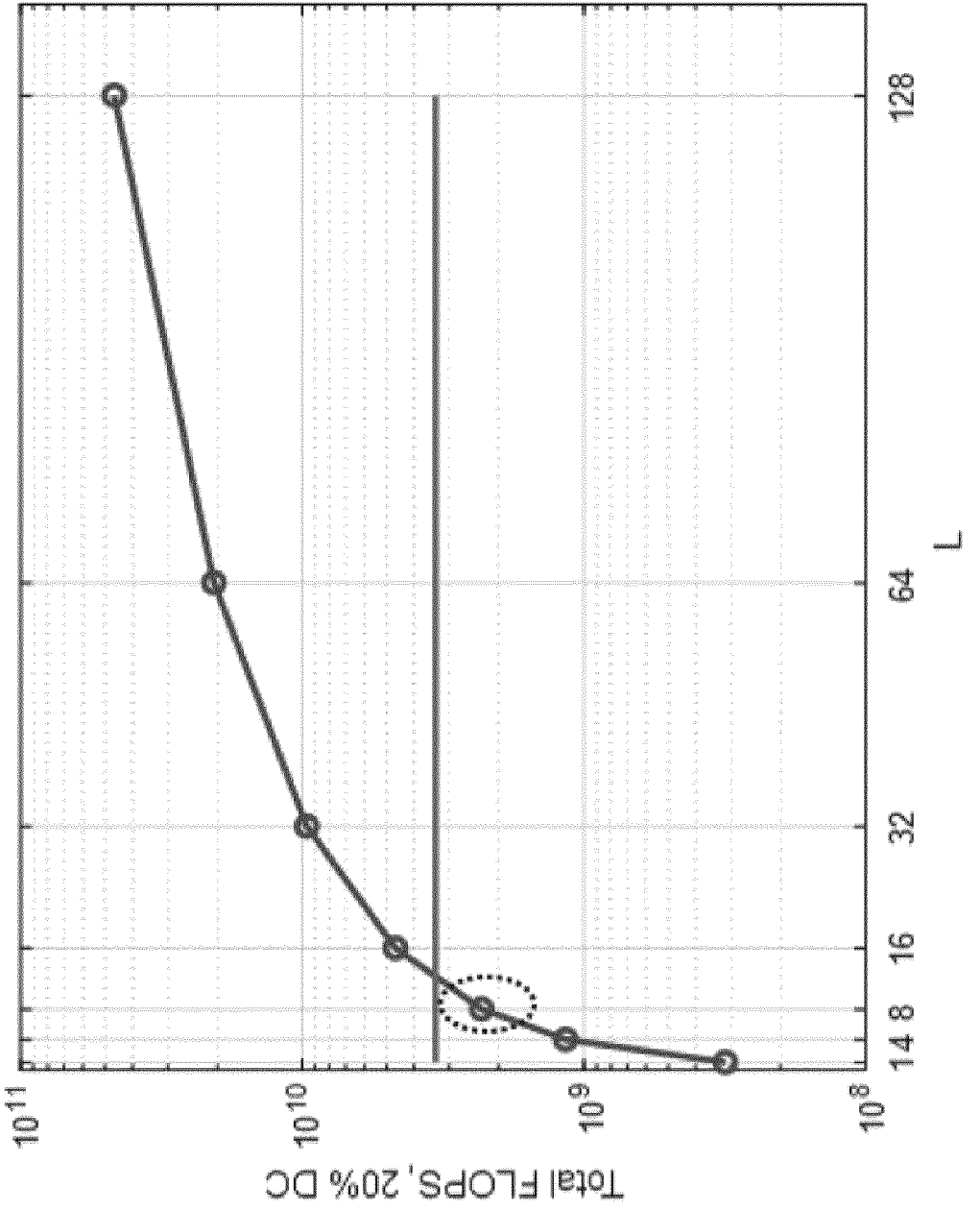

FIG. 15 illustrates some example antenna branch groupings for a dual-polarized antenna array having 64 antenna elements for each polarization. Thus, there are a total of 128 antenna elements. FIG. 15 illustrates different group sizes. The performance and complexity results using different group sizes are shown by FIGS. 16 and 17 for a simulation for one particular implementation. These simulation results show that groups of eight antenna branches seems to be a good compromise considering computational complexity, implementation complexing, performance, and scalability. More specifically, as can been seen in FIG. 16, the performance of group combined DPD in terms of ACLR and EVM is near that of per branch MISO DPD for a group size of 8. As the group size increases (e.g., to 32, 64, or higher), performance decreases. A group size of 8 (or 16) is a good compromise. Similarly, FIG. 17 shows that the number of FLOPS increases as the group size increases. Again, a group size of 8 (or 16) is a good compromise.

Figure 18:
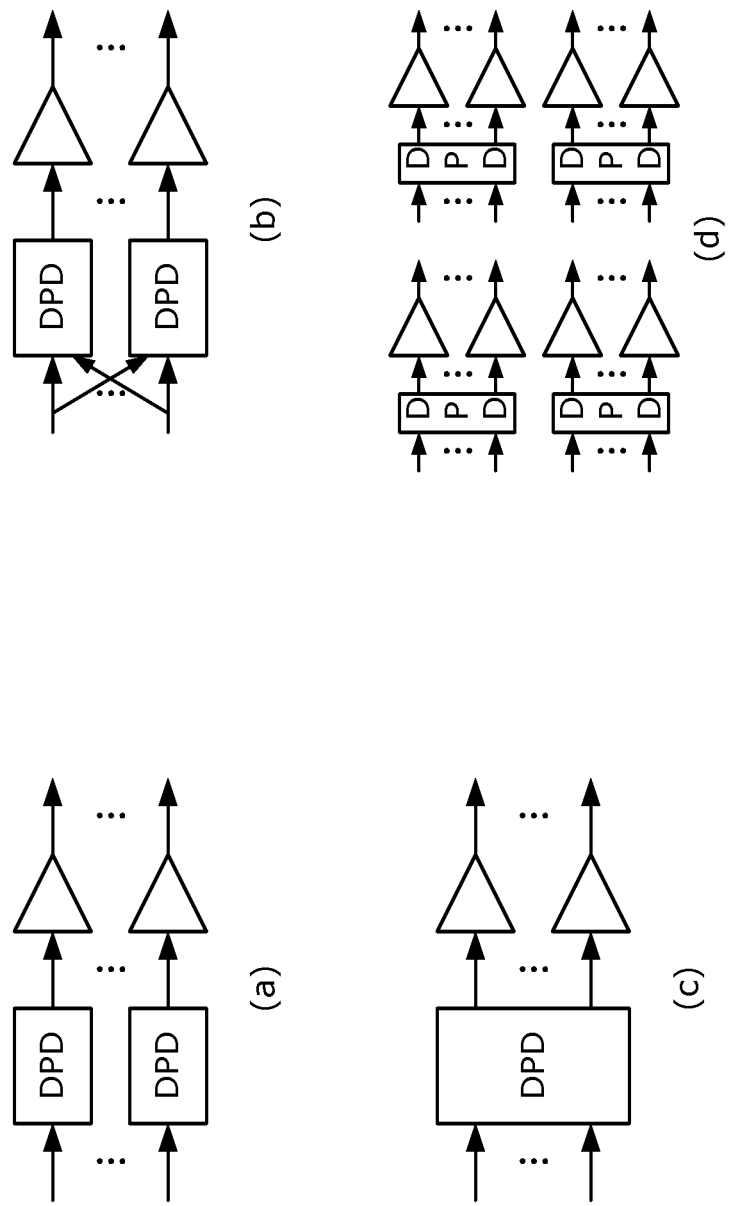
FIG. 18 illustrates several MIMO DPD options.

FIG. 18 illustrates four different options for MIMO DPD, namely, Single Input Single Output (SISO) DPD, MISO DPD, combined MIMO DPD, and group combined MIMO DPD. SISO DPD is known in the art. The present disclosure provides DPD schemes for MISO DPD (see, e.g., FIGS. 1 and 4 and the corresponding description above), combined MIMO DPD (see, e.g., FIGS. 5 through 11 and the corresponding description above), and group combined MIMO DPD (see, e.g., FIGS. 12 through 17 and the corresponding description above).

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processors (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

At least some of the following abbreviations may be used in this disclosure. If there is an inconsistency between abbreviations, preference should be given to how it is used above. If listed multiple times below, the first listing should be preferred over any subsequent listing(s).

AAS Advanced Antenna System
ACLR Adjacent Channel Leakage Ratio
ADC Analog to Digital Conversion
DAC Digital to Analog Conversion
DI Dual Input
DI-PA Dual Input Power Amplifier
DPD Digital Predistortion
DSP Digital Signal Processor
EM Expectation Maximization
EVM Error Vector Magnitude
FDD Frequency Division Duplexing
FLOPS Floating Point Operations
GMP Generalized Memory Polynomial
ILA Indirect Learning Architecture
ILC Iterative Learning Control
MIMO Multiple Input Multiple Output
MISO Multiple Input Single Output
PA Power Amplifier
RAM Random Access Memory
RBF Radial Basis Function
RF Radio Frequency
ROM Read Only Memory
SISO Single Input Single Output
TDD Time Division Duplexing Those skilled in the art will recognize improvements and modifications to the embodiments of the present disclosure.

All such improvements and modifications are considered within the scope of the concepts disclosed herein.

REFERENCES

[1] T. L. Marzetta, "Noncooperative cellular wireless with unlimited numbers of base station antennas," IEEE Trans. Wireless Commun., vol. 9, no. 11, pp. 3590-3600, November 2010.

[2] D. M. Pozar, "Microwave Engineering," $4^{th}$ ed., Sec. 9.4, pp. 475-482, Hoboken, N.J., USA: Wiley, 2011.

[3] D. Saffar et al., "Behavioral modeling of MIMO nonlinear systems with multivariable polynomials, Sec. III," IEEE Trans. Microwave Theory Tech., vol. 59, no. 11, pp. 2994-3003, November 2011.

[4] S. Bassam et al., "Crossover digital predistorter for the compensation of crosstalk and nonlinearity in MIMO transmitters, Sec. III," IEEE Trans. Microwave Theory Tech., vol. 57, no. 5, pp. 1119-1128, May 2009.

[5] A. Abdelhafiz et al., "A high-performance complexity reduced behavioral model and digital predistorter for MIMO systems with crosstalk, Sec. III," IEEE Trans. Commun., vol. 64, no. 5, pp. 1996-2004, May 2016.

[6] S. Amin et al., "Behavioral modeling and linearization of crosstalk and memory effects in RF MIMO transmitters, Sec. II, IV," IEEE Trans. Microwave Theory Tech., vol. 62, no. 4, pp. 810-823, April 2014.

[7] K. Hausmair et al., "Prediction of Nonlinear Distortion in Wideband Active Antenna Arrays, Sec. III, IV," IEEE Trans. Microwave Theory Tech., vol. 65, no. 11, pp. 4550-4563, November 2017.

[8] C. Eun et al., "A new Volterra predistorter based on the indirect learning architecture, Sec. III," IEEE Trans. Signal Processing, vol. 45, no. 1, pp. 223-227, January 1997.

[9] F. M. Barradas et al., "Digital predistortion of RF PAs for MIMO transmitters based on the equivalent load, Sec. I, II, III," Workshop Integr. Nonlinear Microw. Millimetre-Wave Circuits, pp. 1-4, April 2017.

[10] J. Chani-Cahuana et al., "Iterative Learning Control for RF Power Amplifier Linearization, Sec. II, III," IEEE Trans. Microwave Theory Tech., vol. 64, no. 9, pp. 2778-2789, September 2006.

[11] M. Isaksson et al., "Wide-band dynamic modeling of power amplifiers using radial-basis function neural networks, Sec. III," IEEE Trans. Microwave Theory Tech., vol. 53, no. 11, pp. 3422-3428, November 2005.

[12] E. Zenteno et al., "Finding Structural Information About RF Power Amplifiers Using an Orthogonal Nonparametric Kernel Smoothing Estimator, Sec. II," IEEE Trans. Vehicular Technology, vol. 65, no. 5, pp. 2883-2889, May 2016.

[13] D. Morgan et al., "A generalized memory polynomial model for digital predistortion of RF power amplifiers, Sec. I," IEEE Trans. Signal Process., vol. 54, no. 10, pp. 3852-3860, October 2006.

[14] M. Hamid et al., "Non-parametric spectrum cartography using adaptive radial basis functions, Sec. III," 2017 IEEE Int. Conf. Acoustics, Speech and Signal Processing (ICASSP), pp. 3599-3603, New Orleans, La., USA, 2017.

What is claimed is:

1. A Multiple-Input Multiple-Output, MIMO, transmitter, comprising:
a plurality of antenna branches comprising a respective plurality of power amplifiers coupled to a respective plurality of antenna elements; and
two or more Digital Predistortion, DPD, systems each operable to, for a respective group of antenna branches of two or more groups of antenna branches, the two or more groups of antenna branches being a disjoint subset of the plurality of antenna branches:
determine one or more model parameters for a combined MIMO DPD scheme for the group of antenna branches, the combined MIMO DPD scheme being an Iterative Learning Control, ILC, combined MIMO DPD scheme with kernel regression, wherein the DPD system is operable to determine the one or more model parameters by being operative to:
obtain a number, N, of samples of each of a plurality of input signals in a respective one of two or more respective groups of input signals;
determine a desired combined input signal, $U_s$, for the respective one of the two or more groups of antenna branches;
generate a kernel regression matrix, $\theta_s$, for the respective one of the two or more groups of antenna branches based on the number, N, of samples of each of the plurality of input signals in the respective one of the two or more respective groups of input signals; and
compute the one or more model parameters for a DPD model utilized by the DPD system to predistort the plurality of input signals in the respective one of the two or more respective groups of input signals based on the kernel regression matrix, $\theta_s$, and the desired input signal, $U_s$, for the respective one of the two or more groups of antenna branches; and
wherein the two or more DPD systems are further operable to predistort the two or more respective groups of input signals for the group of antenna branches to provide two or more respective groups of predistorted input signals for the two or more groups of antenna branches, respectively, based on the respective determined one or more model parameters in accordance with the combined MIMO DPD scheme for the group of antenna branches;
wherein each group of antenna branches comprises at least two of the plurality of antenna branches.

2. The MIMO transmitter of claim 1 wherein, in order to determine the desired combined input signal, $U_s$, for the respective one of the two or more groups of antenna branches, each DPD system of the two or more DPD systems is further operable to:
initialize the desired combined input signal, $U_s$, for the respective one of the two or more groups of antenna branches;
iteratively perform the following until at least one predefined criterion is satisfied:
determine an error, $E_s$, based on a difference between:
(a) a desired combined output signal of the respective one of the two or more groups of antenna branches and (b) an actual combined output signal of the respective one of the two or more groups of antenna branches when the desired combined input signal, $U_s$, is applied to the respective one of the two or more respective groups of antenna branches; and
update the desired combined input signal, $U_s$, for the respective one of the two or more groups of antenna branches based on the error, $E_s$.

3. The MIMO transmitter of claim 1 wherein the one or more model parameters are weights applied by the DPD system to predistort the plurality of input signals in the respective one of the two or more respective groups of input signals.

4. The MIMO transmitter of claim 1 wherein the ILC combined MIMO DPD scheme with kernel regression uses Radial Basis Function, RBF, kernels.

5. The MIMO transmitter of claim 1 wherein the ILC combined MIMO DPD scheme with kernel regression uses Generalized Memory Polynomial, GMP, bases as kernels.

6. The MIMO transmitter of claim 1 wherein the ILC combined MIMO DPD scheme with kernel regression accounts for memory effects.

7. A method of performing Digital Predistortion, DPD, in a Multiple-Input Multiple-Output, MIMO, transmitter comprising a plurality of antenna branches comprising a respective plurality of power amplifiers coupled to a respective plurality of antenna elements, the method comprising:
  for each group of antenna branches of two or more groups of antenna branches, the two or more groups of antenna branches being a disjoint subset of the plurality of antenna branches:
    determining one or more model parameters for a combined MIMO DPD scheme for the group of antenna branches, the combined MIMO DPD scheme being an Iterative Learning Control, ILC, combined MIMO DPD scheme with kernel regression, wherein determining the one or more model parameters comprises:
      obtaining a number, N, of samples of each of a plurality of input signals in a respective one of two or more respective groups of input signals;
      determining a desired combined input signal, $U_s$, for the respective one of the two or more groups of antenna branches;
      generating a kernel regression matrix, $\theta_s$, for the respective one of the two or more groups of antenna branches based on the number, N, of samples of each of the plurality of input signals in the respective one of the two or more respective groups of input signals; and
      computing the one or more model parameters for a DPD model utilized by a DPD system to predistort the plurality of input signals in the respective one of the two or more respective groups of input signals based on the kernel regression matrix, $\theta_s$, and the desired combined input signal, $U_s$, for the respective one of the two or more groups of antenna branches; and
    predistorting the two or more respective groups of input signals for the group of antenna branches to provide two or more respective groups of predistorted input signals for the two or more groups of antenna branches, respectively, based on the respective determined one or more model parameters in accordance with the combined MIMO DPD scheme for the group of antenna branches;
  wherein each group of antenna branches comprises at least two of the plurality of antenna branches.

8. A Multiple-Input Multiple-Output, MIMO, transmitter, comprising:
  a plurality of antenna branches comprising a respective plurality of power amplifiers coupled to a respective plurality of antenna elements; and
  a plurality of Iterative Learning Control, ILC, Digital Predistortion, DPD, systems operable to predistort a plurality of input signals for the plurality of antenna branches, respectively, using an ILC per branch MIMO DPD scheme with kernel regression;
  wherein each ILC DPD system of the plurality of ILC DPD systems is further operable to:
    obtain a number, N, of samples of a respective one of the plurality of input signals;
    determine a desired input signal, $U_l$, for a respective one of the plurality of antenna branches;
    generate a kernel regression matrix, $\theta_l$, for the respective one of the plurality of antenna branches based on the number, N, of samples of the respective one of the plurality of input signals; and
    compute one or more model parameters for a DPD model utilized by the ILC DPD system to predistort the respective one of the plurality of input signals based on the kernel regression matrix, $\theta_l$, and the desired input signal, $U_l$, for the respective one of the plurality of antenna branches.

9. The MIMO transmitter of claim 8 wherein each ILC DPD system of the plurality of ILC DPD systems is further operable to generate the kernel regression matrix, $\theta_l$, for the respective one of the plurality of antenna branches based on: (a) the number, N, of samples of the respective one of the plurality of input signals and (b) the number, N, of samples of one or more additional input signals from among the plurality of input signals.

10. The MIMO transmitter of claim 8 wherein, in order to determine the desired input signal, $U_l$, for a respective one of the plurality of antenna branches, each ILC DPD system of the plurality of ILC DPD systems is further operable to:
  initialize the desired input signal, $U_l$, for the respective one of the plurality of antenna branches;
  iteratively perform the following until at least one predefined criterion is satisfied:
    determine an error, $E_l$, based on a difference between (a) a desired output signal of the respective one of the plurality of antenna branches and (b) an actual output signal of the respective one of the plurality of antenna branches when the desired input signal, $U_l$, is applied to the respective one of the plurality of antenna branches;
    update the desired input signal, $U_l$, for the respective one of the plurality of antenna branches based on the error, $E_l$.

11. The MIMO transmitter of claim 8 wherein the one or more model parameters are weights applied by the ILC DPD system to predistort the respective one of the plurality of input signals.

12. The MIMO transmitter of claim 8 wherein the ILC per branch MIMO DPD scheme with kernel regression uses Radial Basis Function, RBF, kernels.

13. The MIMO transmitter of claim 8 wherein the ILC per branch MIMO DPD scheme with kernel regression takes into account memory effects to a predefined memory depth.

14. The MIMO transmitter of claim 8 wherein the ILC per branch MIMO DPD scheme accounts for antenna coupling effects.

15. A method of performing Digital Predistortion, DPD, in a Multiple-Input Multiple-Output, MIMO, transmitter comprising a plurality of antenna branches comprising a respective plurality of power amplifiers coupled to a respective plurality of antenna elements, the method comprising:
  determining one or more model parameters for each antenna branch of the plurality of antenna branches for an Iterative Learning Control, ILC, per branch MIMO DPD scheme with kernel regression; and
  predistorting a plurality of input signals for the plurality of antenna branches, respectively, to provide a respective plurality of predistorted input signals for the plurality of antenna branches based on the determined one or more model parameters in accordance with the ILC per branch MIMO DPD scheme with kernel regression; wherein predistorting the plurality of input signals for the plurality of antenna branches comprises:

obtaining a number, N, of samples of a respective one of the plurality of input signals;

determining a desired input signal, $U_j$, for a respective one of the plurality of antenna branches;

generating a kernel regression matrix, $\theta_j$, for the respective one of the plurality of antenna branches based on the number, N, of samples of the respective one of the plurality of input signals; and computing one or more model parameters for a DPD model utilized by the ILC DPD system to predistort the respective one of the plurality of input signals based on the kernel regression matrix, $\theta_j$, and the desired input signal, $U_j$, for the respective one of the plurality of antenna branches.

16. A Multiple-Input Multiple-Output, MIMO, transmitter, comprising:

a plurality of antenna branches comprising a respective plurality of power amplifiers coupled to a respective plurality of antenna elements; and a single Digital Predistortion, DPD, system operable to, for a single group of antenna branches comprising at least two of the plurality of antenna branches:

determine one or more model parameters for a combined MIMO DPD scheme for the group of antenna branches, the combined MIMO DPD scheme being an Iterative Learning Control, ILC, combined MIMO DPD scheme with kernel regression by being operable to:

obtain a number, N, of samples of each of a plurality of input signals;

determine a desired combined input signal, U, for the plurality of antenna branches;

generate a kernel regression matrix, $\theta$, for the plurality of antenna branches based on the number, N, of samples of each of the plurality of input signals; and compute one or more model parameters for a DPD model utilized by the single DPD system to predistort the plurality of input signals based on the kernel regression matrix, $\theta$, and the desired combined input signal, U; and predistort the plurality of input signals for the group of antenna branches to provide a plurality of predistorted input signals for the plurality of antenna branches based on the determined one or more model parameters in accordance with the combined MIMO DPD scheme for the group of antenna branches.

17. The MIMO transmitter of claim 16 wherein, in order to determine the desired combined input signal, U, for the plurality of antenna branches, the single DPD system is further operable to:

initialize the desired combined input signal, U, for the plurality of antenna branches;

iteratively perform the following until at least one predefined criterion is satisfied:

determine an error, E, based on: (a) a difference between a desired combined output signal of the plurality of antenna branches and (b) an actual combined output signal of the plurality of antenna branches when the desired combined input signal, U, is applied to the plurality of antenna branches; and update the desired combined input signal, U, for the plurality of antenna branches based on the error, E.

18. The MIMO transmitter of claim 16 wherein the one or more model parameters are weights applied by the single DPD system to predistort the plurality of input signals.

19. A method of performing Digital Predistortion, DPD, in a Multiple-Input Multiple-Output, MIMO, transmitter comprising a plurality of antenna branches comprising a respective plurality of power amplifiers coupled to a respective plurality of antenna elements, the method comprising:

for a single group of antenna branches comprising at least two of the plurality of antenna branches:

determining one or more model parameters for a combined MIMO DPD scheme for the group of antenna branches, the combined MIMO DPD scheme being an Iterative Learning Control, ILC, combined MIMO DPD scheme with kernel regression, wherein determining the one or more model parameters comprises:

obtaining a number, N, of samples of each of a plurality of input signals;

determining a desired combined input signal, U, for the plurality of antenna branches;

generating a kernel regression matrix, $\theta$, for the plurality of antenna branches based on the number, N, of samples of each of the plurality of input signals; and computing one or more model parameters for a DPD model utilized by the single DPD system to predistort the plurality of input signals based on the kernel regression matrix, $\theta$, and the desired combined input signal, U; and predistorting the plurality of input signals for the group of antenna branches to provide a plurality of predistorted input signals for the plurality of antenna branches based on the determined one or more model parameters in accordance with the combined MIMO DPD scheme for the group of antenna branches.

* * * * *